United States Patent

Kaneko et al.

[11] Patent Number: 6,081,537
[45] Date of Patent: Jun. 27, 2000

[54] SIGNAL TRAP DEVICE AND METHOD, RECORDING MEDIUM REPLAY DEVICE AND METHOD, AND SIGNAL EXTRACTION DEVICE AND METHOD

[75] Inventors: Masayasu Kaneko, Ibaragi; Tsutomu Mikami, Saitama, both of Japan

[73] Assignee: Sony Corporation, Tokyo, Japan

[21] Appl. No.: 08/859,401

[22] Filed: May 20, 1997

[30] Foreign Application Priority Data

May 31, 1996 [JP] Japan ..................................... 8-137942

[51] Int. Cl.⁷ ................ H04J 1/00; H04N 5/44; H04N 5/60; H04B 1/10
[52] U.S. Cl. ............... 370/480; 348/736; 455/205; 455/303
[58] Field of Search ..................... 370/480, 343, 370/374, 481, 483, 485, 486, 487, 488; 348/631, 666, 470, 493, 736, 738; 455/45, 205, 206, 303

[56] References Cited

U.S. PATENT DOCUMENTS 4,862,252  8/1989  Kuroda .................................. 348/666
4,943,849  7/1990  Faroudja et al. ....................... 348/470

*Primary Examiner*—Huy D. Vu
*Assistant Examiner*—Kevin C. Harper
*Attorney, Agent, or Firm*—Frommer Lawerence & Haug, LLP; William S. Frommer

[57] ABSTRACT

A signal trap device and method for trapping a desired FM signal out of a frequency multiplexed signal where a plurality of FM signals are included in a frequency multiplexed form. A replay signal reproduced from a video cassette tape is supplied directly to a subtracter while being fed to a fixed delay circuit and a variable delay circuit to be delayed therein by a predetermined delay time. The delayed signal is supplied also to the subtracter, which then subtracts the delayed signal from the reproduced replay signal and outputs the result of such subtraction therefrom. The delay time of the fixed delay circuit is set to correspond to the center frequency of the carrier of the desired FM signal to be trapped. Meanwhile the delay time of the variable delay circuit is so set as to correspond to the signal obtained by demodulating the desired FM signal. Thus, the desired FM signal can be trapped properly without any harmful influence on the other FM signal.

14 Claims, 30 Drawing Sheets

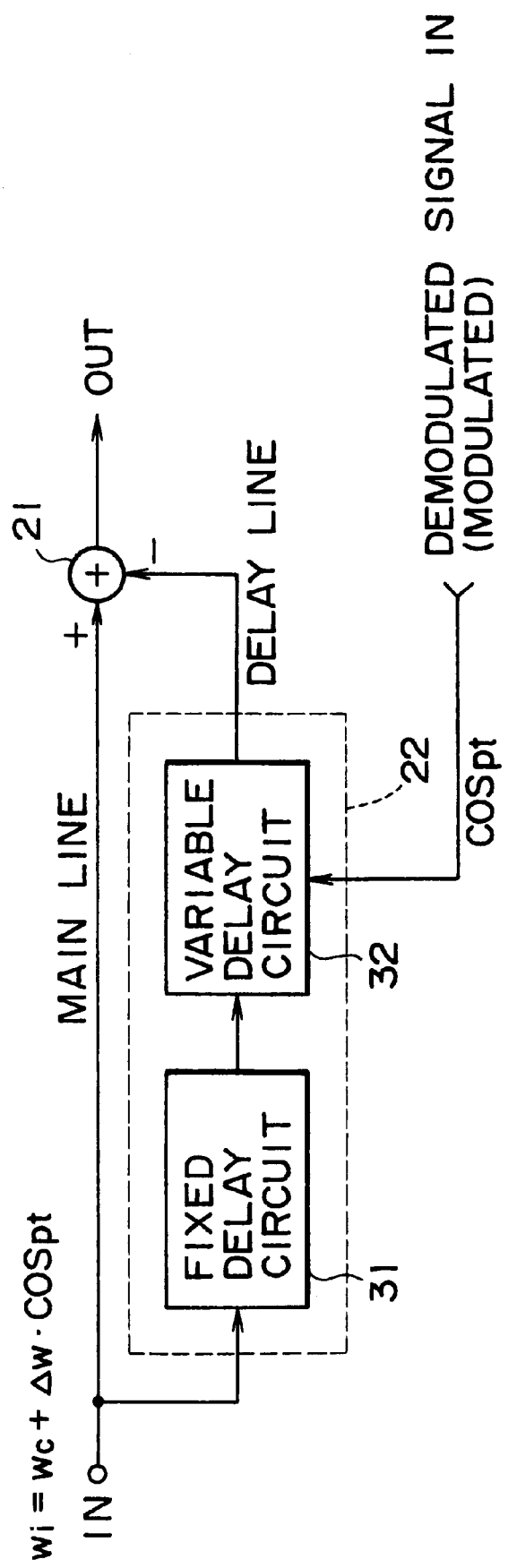

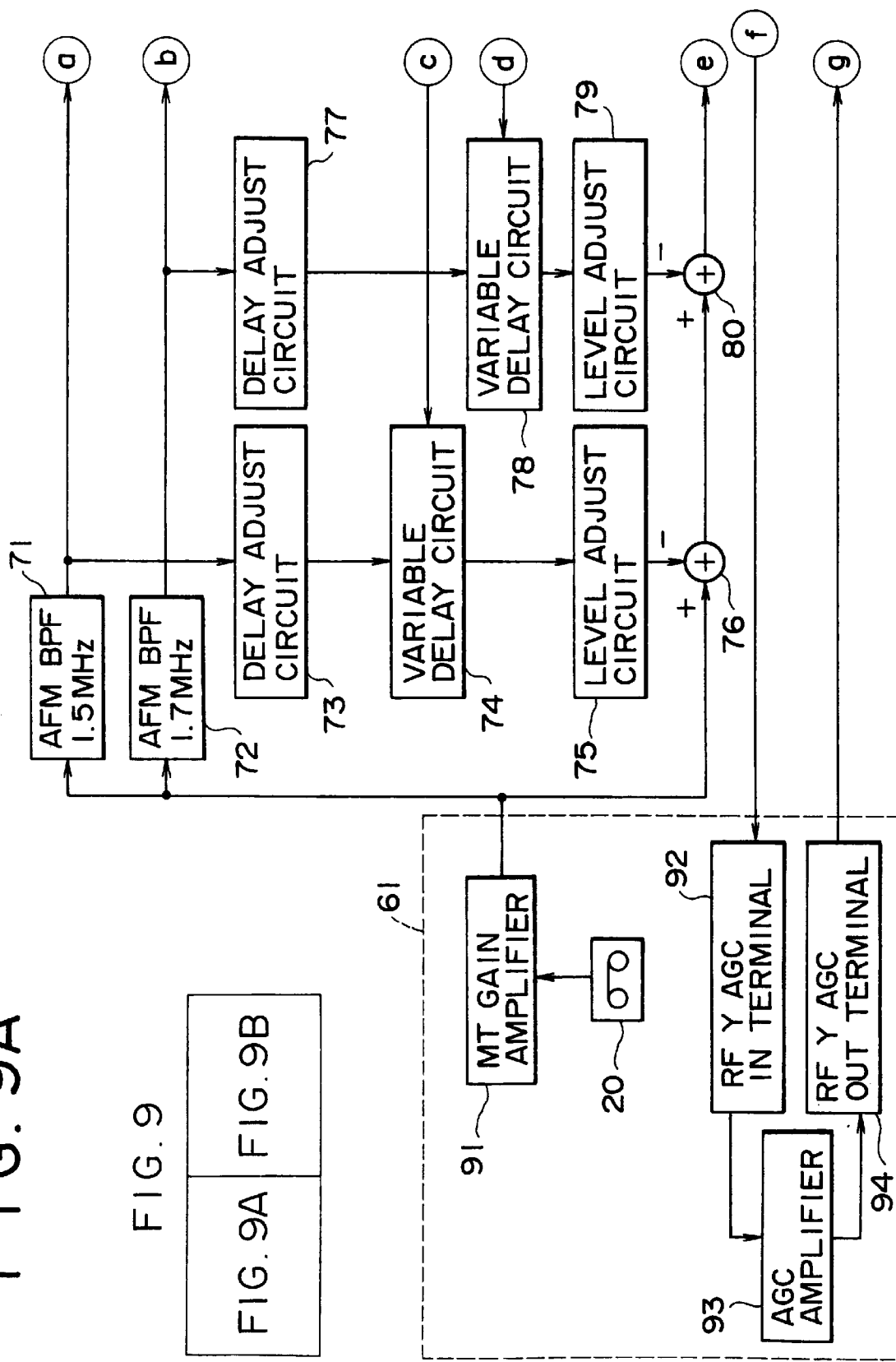

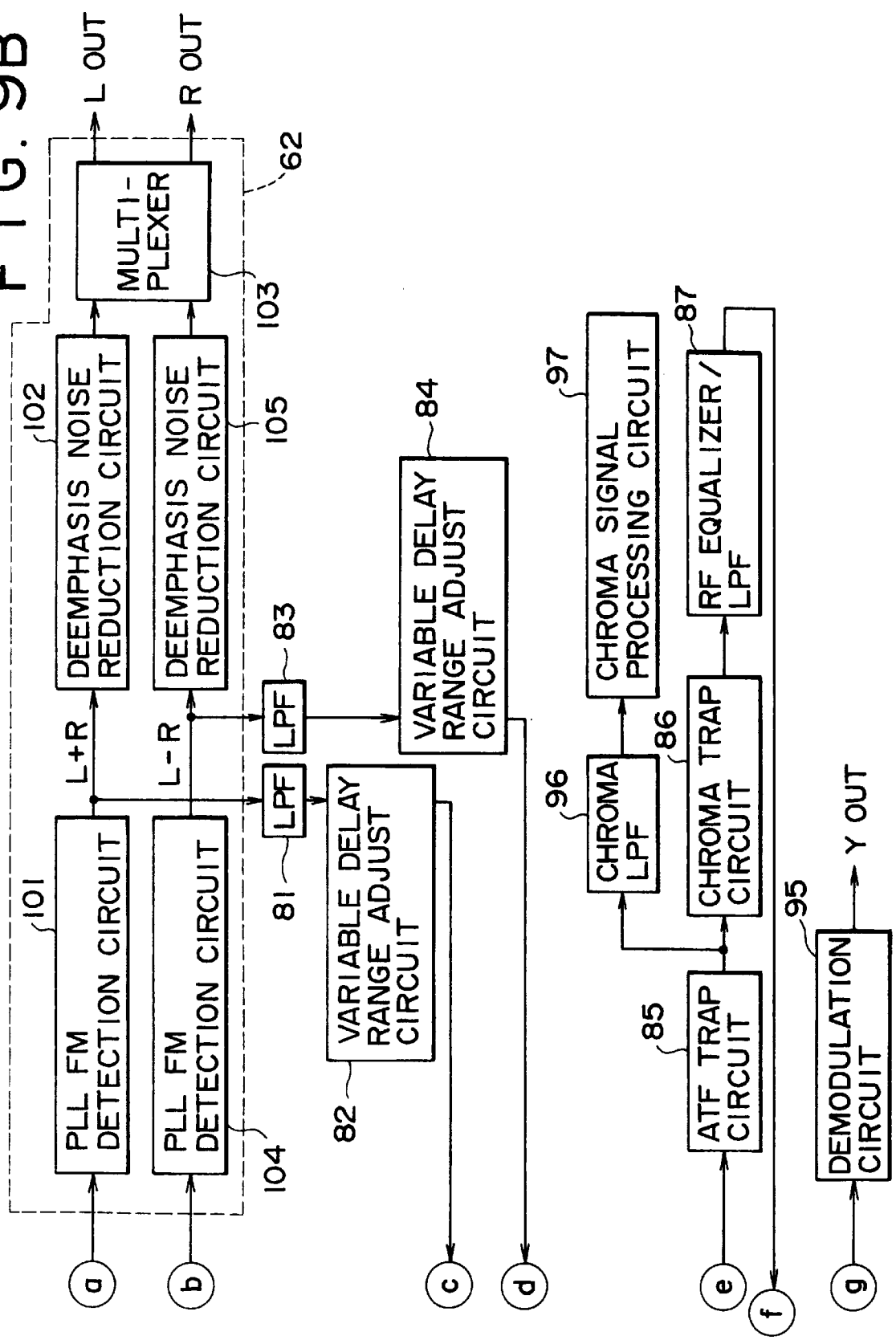

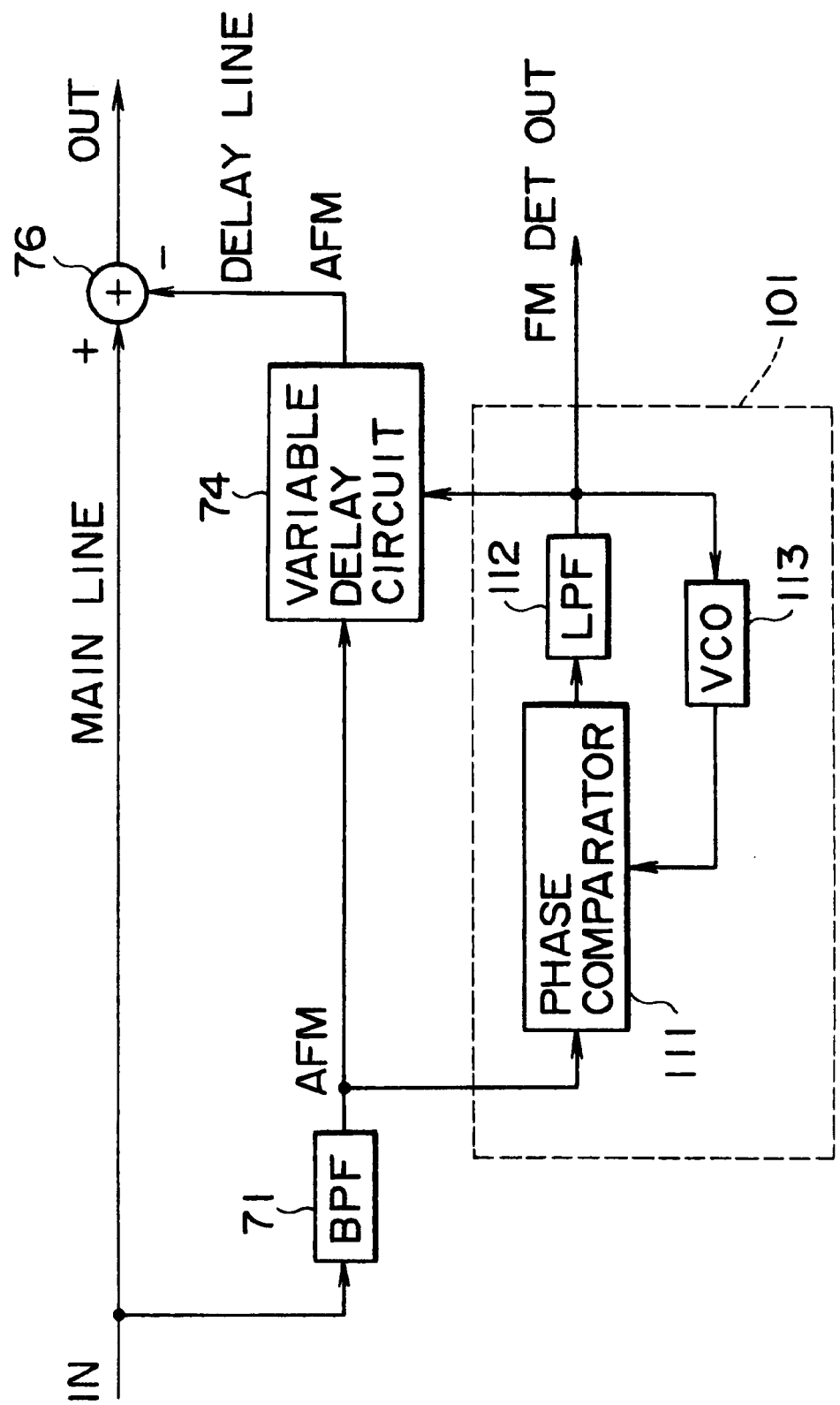

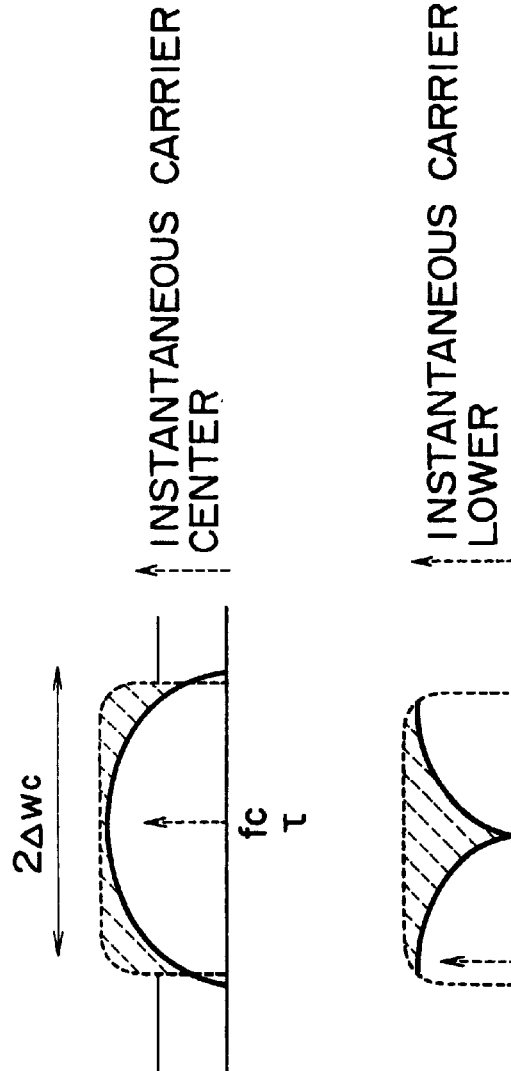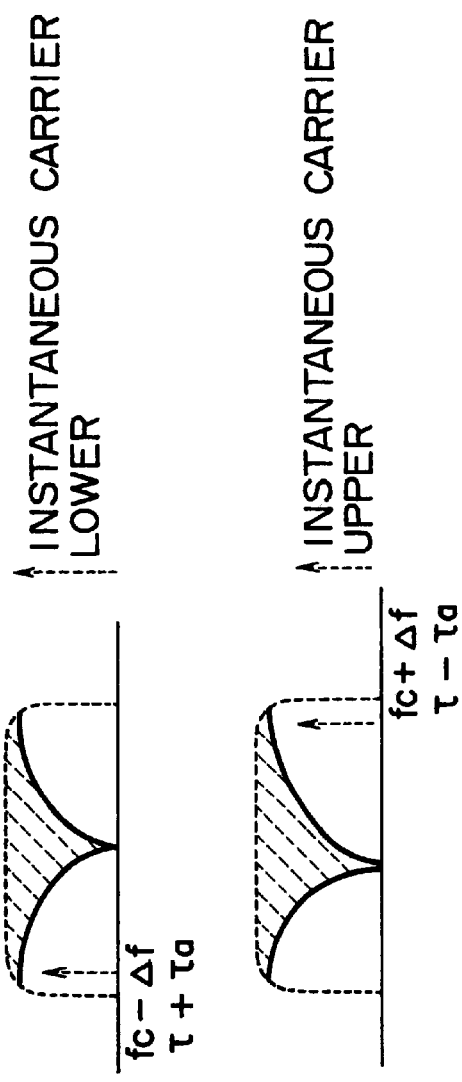
F I G. 27A
F I G. 27B
F I G. 27C

SIGNAL TRAP DEVICE AND METHOD, RECORDING MEDIUM REPLAY DEVICE AND METHOD, AND SIGNAL EXTRACTION DEVICE AND METHOD

BACKGROUND OF THE INVENTION

1. Field of the Invention

The present invention relates to a signal trap device and method, a recording medium replay device and method, and a signal extraction device and method, and more particularly to those adapted for use in separating an audio FM signal, which is recorded on a magnetic tape, from a luminance FM signal.

2. Description of the Related Art

FIG. 29 shows a spectrum of signals recorded on a magnetic tape in an 8 mm-tape video cassette recorder (trade name). As shown in the diagram, there is recorded, in the highest frequency band, an FM luminance signal obtained through frequency modulation of a predetermined carrier with a luminance signal. A carrier of 743.444 kHz, which is lower in frequency than the FM luminance signal, is amplitude-modulated with a low-frequency converted chroma signal. And in a band further lower in frequency than the low-frequency converted chroma signal, there is disposed a four-frequency tracking pilot signal (ATF signal).

Moreover, between the FM luminance signal and the low-frequency converted chroma signal, there are disposed an FM audio signal obtained through frequency modulation of a carrier of 1.5 MHz with the sum (L+R signal) of left (L) and right (R) stereo signals, and also an FM audio signal obtained through frequency modulation of a carrier of 1.7 MHz with the difference (L−R signal) of the stereo signals.

Since these signals are recorded on a magnetic tape after being processed through frequency multiplexing, the original signals can be reproduced by trapping signals of any unrequired frequency bands, then extracting the signals of desired frequency bands and executing frequency demodulation of the extracted signals.

For example, when the FM luminance signal (hereinafter referred to as YFM signal) is separated from the replay signal reproduced from the magnetic tape, the FM audio signal (hereinafter referred to as AFM signal) is first trapped by an LC tuning type AFM trap circuit consisting of a resistor 1, a coil 2 and a capacitor 3 as shown in FIG. 30A, or by an LC tuning type AFM trap circuit consisting of a coil 11, a capacitor 12 and a resistor 13 as shown in FIG. 30B.

More specifically, the AFM trap circuit shown in FIG. 30(A) or 30(B) is so formed as to widely attenuate the signals of frequency bands of 1.5 MHz and 1.7 MHz, wherein the AFM signal is trapped from the reproduced replay signal.

Further the YFM signal is extracted from the replay signal where the low-frequency converted chroma signal and the ATF signal have already been trapped, and then the YFM signal thus extracted is demodulated.

With regard to the frequency deviation Δw of the FM signal and the modulation angular frequency p thereof, the exclusive bandwidth of the frequency-modulated waves becomes approximately 2(Δw+p). Therefore, in order to trap the FM signal with any frequency deviation from the replay signal reproduced from a magnetic tape, it is necessary in the related art to trap the frequency band of a considerably wide range including 2(Δw+p). As shown in FIG. 29, the frequency bands of the AFM signal and the YFM signal are very close to each other. For this reason, in trapping the AFM signal from the reproduced signal, the low-frequency band component of the YFM signal is also trapped to consequently deteriorate the resolution with another disadvantage of hardly attaining a high-quality picture.

Furthermore, if the circuit is so formed as to sharply trap only the center frequency of the carrier of the AFM signal, an AM component is generated in accordance with the frequency deviation of the FM signal to eventually cause horizontal streaks with shading on the screen.

It has been customary heretofore that such disadvantages are existent also in a Betamax video cassette recorder (trade name) for example.

SUMMARY OF THE INVENTION

It is therefore an object of the present invention to realize improvements capable of exactly separating and extracting an FM signal of a desired frequency band while trapping any FM signals of predetermined frequency bands.

According to a first aspect of the present invention, there is provided a signal trap device which comprises a demodulation means for demodulating an FM signal to be trapped and outputting the demodulated signal; a delay means for delaying the FM signal to be trapped in response to the demodulated signal outputted from the demodulation means; and a subtraction means for subtracting the delayed FM signal obtained from the delay means from a frequency multiplexed signal.

According to a second aspect of the present invention, there is provided a signal trap method which comprises the steps of demodulating an FM signal to be trapped and outputting the demodulated signal; delaying the FM signal to be trapped in response to the demodulated signal; and subtracting the delayed FM signal from a frequency multiplexed signal.

According to a third aspect of the present invention, there is provided a recording medium replay device which comprises an extraction means for extracting a first FM signal from a reproduced signal; a first demodulation means for demodulating the extracted first FM signal and outputting a first demodulated signal; a delay means for delaying the extracted first FM signal in response to the first demodulated signal outputted from the first demodulation means; a subtraction means for subtracting, from the reproduced signal, the first FM signal delayed by the delay means; and a second demodulation means for demodulating a second FM signal from the output of the subtraction means and then outputting a second demodulated signal.

According to a fourth aspect of the present invention, there is provided a recording medium replay method which comprises the steps of extracting a first FM signal from a reproduced signal obtained from a recording medium; demodulating the extracted first FM signal and outputting a first demodulated signal; delaying the extracted first FM signal in response to the first demodulated signal; subtracting the delayed first FM signal from the reproduced signal; and demodulating the second FM signal obtained through subtraction and outputting a second demodulated signal.

According to a fifth aspect of the present invention, there is provided a signal extraction device which comprises a demodulation means for demodulating an FM signal to be extracted and then outputting the demodulated signal; a delay means for delaying the FM signal to be extracted in response to the demodulated signal outputted from the demodulation means; and an addition means for adding a frequency multiplexed signal to the FM signal delayed by the delay means.

And according to a sixth aspect of the present invention, there is provided a signal extraction method which comprises the steps of demodulating an FM signal to be extracted and then outputting the demodulated signal; delaying the FM signal to be extracted in response to the demodulated signal; and adding a frequency multiplexed signal to the delayed FM signal.

In the signal trap device and method mentioned, the modulated signal is delayed in response to the demodulated signal, and the delayed modulated signal is subtracted from the non-delayed modulated signal.

In the recording medium replay device and method mentioned, the first modulated signal is extracted from the frequency multiplexed signal reproduced from the recording medium, and a first demodulated signal is generated through demodulation of the extracted signal. Subsequently the first modulated signal is delayed in response to the first demodulated signal. Then the delayed first demodulated signal is subtracted from the frequency multiplexed signal, and a second modulated signal is produced from the signal obtained by such subtraction.

In the signal extraction device and method mentioned, the FM signal is delayed in response to the demodulated signal, and then the frequency multiplexed signal and the delayed FM signal are added to each other.

The above and other features and advantages of the present invention will become apparent from the following description which will be given with reference to the illustrative accompanying drawings.

BRIEF DESCRIPTION OF THE DRAWINGS

FIG. 3 is a block diagram showing a structural example of a comb filter which constitutes the signal trap device of the present invention;

FIGS. 9A and 9B is a block diagram showing a structural example of an 8 mm-tape video cassette recorder where a recording medium replay device of the present invention is applied;

FIG. 10 is a block diagram showing a structural example of a comb filter for use in the embodiment of FIG. 9;

FIGS. 27A, 27B and 27C are graphic diagrams for explaining the operation of the signal extraction device in FIG. 25;

DESCRIPTION OF THE PREFERRED EMBODIMENTS

In the present invention, two FM signals of mutually proximate frequency bands are separated from each other by utilizing the correlation thereof.

Components of an AFM signal, which are uncorrelated in a horizontal sync interval and also in a vertical sync interval, have a relatively high correlation in an interval of several microseconds or less for example. In contrast therewith, higher-frequency components of a luminance signal (Y signal) corresponding to such interval generally have a low correlation except a special case where images thereof have some correlation in that interval. Accordingly, when a replay signal (frequency multiplexed signal) reproduced from a magnetic tape and including a high-correlation AFM signal and a low-correlation YFM signal is supplied to a comb filter, the high-correlation AFM signal is widely attenuated (trapped) while the low-correlation YFM signal is outputted substantially without attenuation.

Figure 1:
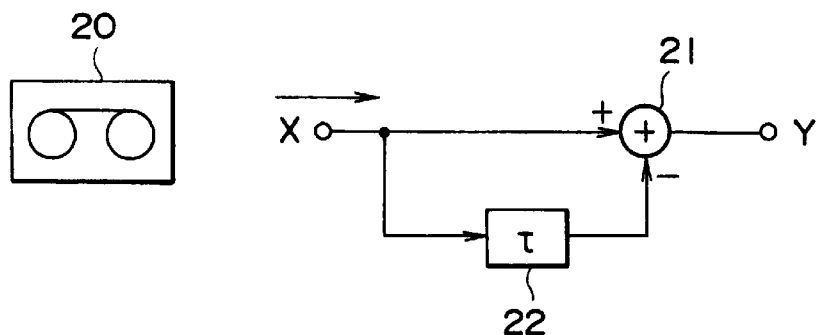
FIG. 1 is a block diagram showing a fundamental structure of a comb filter which constitutes a signal trap device of the present invention.

FIG. 1 shows a structural example of a comb filter. On an 8-mm video cassette tape 20, a composite signal (frequency multiplexed signal) is recorded in the format shown in FIG. 29. The replay signal reproduced from the video cassette tape 20 is inputted via a terminal X to the comb filter and then is supplied to a subtracter 21. Meanwhile the signal inputted via the terminal X is partially delayed in a delay circuit 22 by a time $\tau$ (second) and then is supplied to the subtracter 21. Subsequently in the subtracter 21, the signal delayed by the time $\tau$ in the delay circuit 22 is subtracted from the non-delayed signal inputted via the terminal X and then is outputted from a terminal Y. As described, the AFM signal and the YFM signal are both included in the replay signal reproduced from the video cassette tape 20. However, the AFM signal can be widely attenuated (trapped) by properly setting the delay time $\tau$ to an adequate value which ensures sufficiently high correlation in the AFM signal, so that substantially the AFM signal is not included in the replay signal although the YFM signal is still included therein.

In regard to the input and output x, y of the comb filter, its transfer function G(w) and amplitude characteristic |G(w)| have respective values expressed as follows.

$$\text{Transfer function } G(w) = y/x \quad (1)$$
$$= 1 - e^{\wedge}(-jw\tau)$$

$$\text{Amplitude characteristic}|G(w)| = 2|\text{SIN}w\tau/2| \quad (2)$$

Calculating the relationship between the delay time $\tau$ and the angular frequency (trap angular frequency) $w_c$ trapped in the comb filter of FIG. 1, it is expressed as follows on condition that $|G(w_c)|=0$.

$$w_c \cdot \tau/2 = n\pi \quad (3)$$

$$\tau = n\tau_c \quad (4)$$

where n=0, 1, 2, ... and so forth. The following equations are satisfied in regard to the trap frequency $f_c$.

$$2\pi f_c = w_c$$

$$\tau_c = 1/f_c$$

When the subtraction in the subtracter 21 is executed by adding a signal of reverse polarity, $$n = (2m+1)\tau_c/2$$

where (m=0, 1, 2, ... ).

More specifically, the delay time $\tau$ of the delay circuit 22 needs to be set to a value which is n times the period $\tau_c$ of the frequency $f_c$ to be trapped. It is termed here a trap delay time $\tau_f$. The amplitude characteristics $|G(w)|$ in the case of n=1, 2, 3 are shown in FIGS. 2A, 2B, 2C, respectively.

Figure 2A:
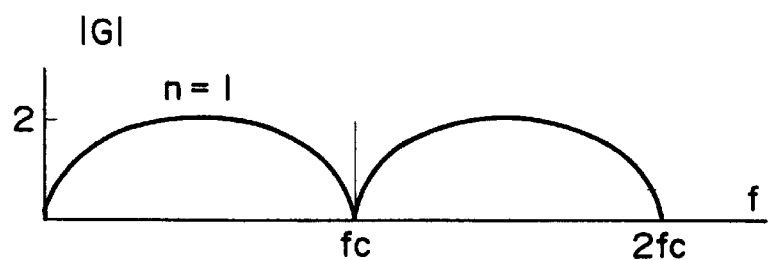
FIGS. 2A, 2B and 2C are graphic diagrams for explaining the output characteristics of a comb filter.
Figure 2B:
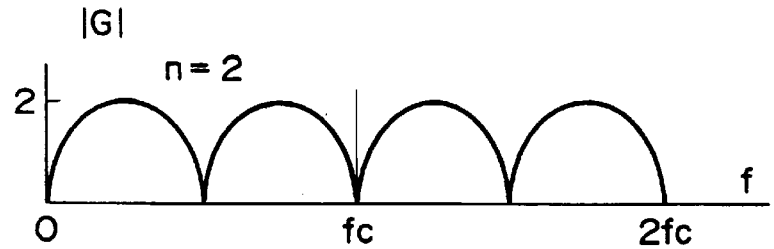
Figure 2C:
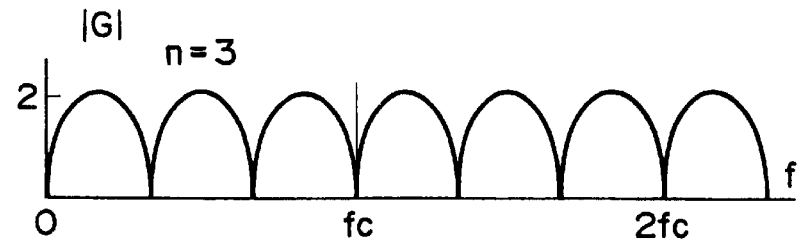

As shown in FIGS. 2A to 2C, the trap characteristic curve in the vicinity of the trap frequency $f_c$ becomes steeper in accordance with rise of the degree of n, i.e., in accordance with increase of the delay time of the delay circuit 22 (see Eq. (4)), whereby a narrower-band trap can be formed.

In this manner, the fixed frequency $f_c$ may be trapped by merely increasing the delay time as related in Eq. (4), but the FM signal with any instantaneous frequency deviation of the carrier fails to be completely trapped if the delay time is kept fixed.

Therefore, the trap delay time relative to the FM signal will now be considered below. The following equation is established in regard to an instantaneous angular frequency wi of the FM signal, a modulated signal a COS pt and a proportional constant Kf.

$$w_i = w_c + K_f \cdot a \cdot COS\, pt = w_c + \Delta w \cdot COS\, Pt \quad (5)$$

where a stands for the modulation level; p for the modulation angular frequency; $\Delta w$ (=$a \cdot K_f = 2\pi \Delta f$) for the angular frequency deviation proportional to the modulation level a; and $\Delta f$ for the frequency deviation.

The FM signal trap delay time $\tau_f$ is expressed as follows by replacing $w_c$ in Eq. (3) with $w_i$ of Eq. (5) where $\Delta w/w_c \ll 1$.

$$\tau_f = 2n\pi/w_i = 2n\pi/w_c(1+(\Delta w/w_c)COS\, pt) \approx 2n\pi(1-(\Delta w/w_c) \cdot COS\, pt)/w_c \quad (6)$$

Since $w_c = 2\pi f_c$, $\Delta w = 2\pi \Delta f$, and $1/f_c = \tau_c$, Eq. (6) may be written as $$\tau_f \approx n\tau_c(1-(\Delta f/f_c) \cdot COS\, pt) \quad (7)$$

$$\approx \tau - \tau_a \cdot COS\, pt$$

where $\tau_a = \tau \cdot (\Delta f/f_c) = \tau \cdot (\Delta w/w_c)$

Comparing Eq. (5) with Eq. (7), it is seen that the angular frequency w and the delay time $\tau$ correspond to each other.

As obvious from comparison of Eq. (4) with Eq. (7), the FM signal can be trapped through utilization of the correlation by dividing the delay circuit 22 into a fixed delay circuit 31 and a variable delay circuit 32 as shown in FIG. 3, and giving a fixed delay $\tau$ in the fixed delay circuit 31 while further causing, in the variable delay circuit 32, a varied delay proportional to the demodulation level which corresponds to the modulation level. Assuming now that $e^{\wedge}(jw_c t)$ is inputted to the delay circuit 22 in FIG. 3, its output is expressed as $$e^{\wedge}(j(w_c(t-\tau)+\tau \cdot \Delta w \cdot COS\, pt))$$

This signifies that a phase modulation of $\tau \cdot \Delta w \cdot COS\, pt$ is executed in the delay circuit 22. In other words, for canceling the FM signal by utilizing the correlation after a lapse of the delay time $\tau$ (second), it is necessary, as shown in FIG. 3, to execute a phase modulation of $\tau \cdot \Delta w \cdot E\, COS\, pt$ in the variable delay circuit 32 in addition to a delay of the time $\tau$ in the fixed delay circuit 31.

In the delay circuit 22, even when the output of a VCO locked to the FM signal is used as a delay signal as in embodiment of FIG. 11 to be described later, the phase modulation needs to be corrected in such a manner that the difference (delay) time between the two inputs to the subtracter 21 becomes equal to a value proportional to $n\tau_c$. If a delay is executed in a main line also as in the embodiment of FIG. 11 to reduce the difference time substantially to zero (n=0), it becomes possible naturally to eliminate the necessity of phase correction (variable delay).

Figure 4A:
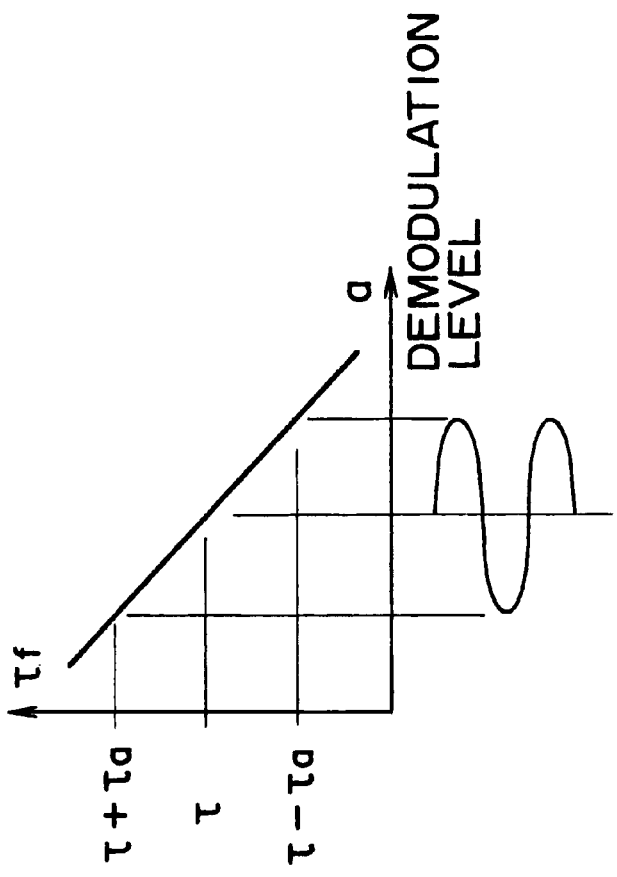
FIGS. 4A and 4B are graphic diagrams for explaining the operation of a variable delay circuit in FIG. 3.
Figure 4B:
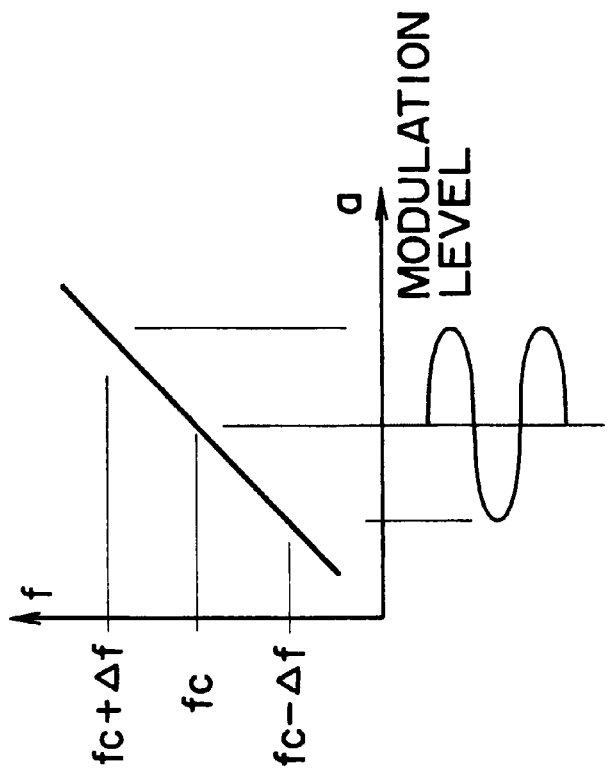

The polarity of the FM signal carrier and the increase or decrease of the delay time are inverse. That is, as shown graphically in FIG. 4A, the FM carrier frequency f is raised from $f_c$ to $f_c+\Delta f$ in accordance with an increase of the modulation level a or is lowered to $f_c-\Delta f$ in accordance with a decrease of the modulation level. Meanwhile, as shown graphically in FIG. 4B, the delay time $\tau$ is decreased to $\tau-\tau_a$ in accordance with an increase of the demodulation level or is increased to $\tau+\tau_a$ in accordance with a decrease thereof correspondingly to the modulation level.

Figure 5:
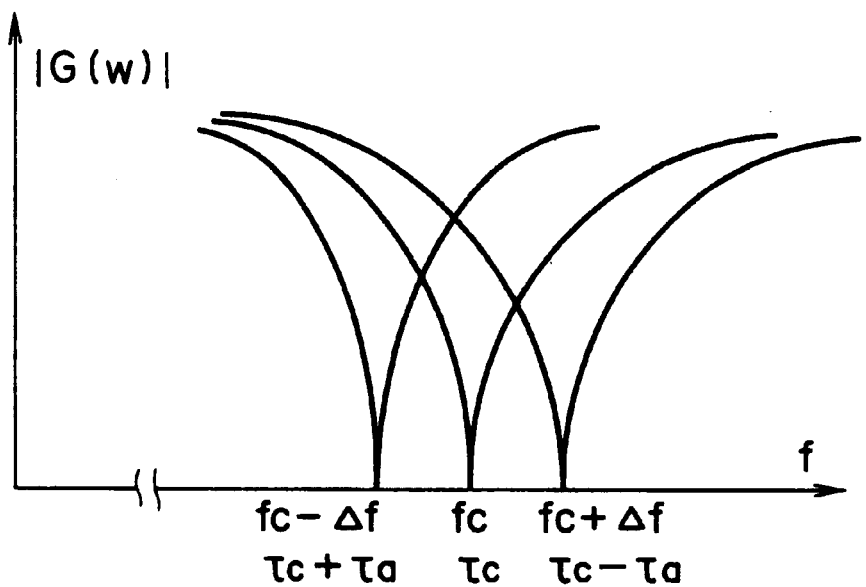
FIGS. 5 and 6 graphically show the output characteristics of the comb filter in FIG. 3.

FIG. 5 graphically represents the amplitude characteristic $|G(w)|$ in the vicinity of the trap frequency $f_c$ in the embodiment of FIG. 3. In this case, the trap frequency $f_c$ is changed in conformity with the frequency deviation $\Delta f$. In other words, the delay time $\tau$ is changed in accordance with the varied delay time $\tau_a$. As shown in FIG. 5, the trap band is widened with a rise of the frequency, but under the condition of $\Delta f/f_c \ll 1$, the trap width difference is substantially negligible regardless of whether the frequency deviation $\Delta f$ is positive or negative.

Next, an explanation will be given on an exemplary case where the delay signal has a band characteristic H(w). The transfer function G(w) in this case is expressed as follows.

$$G(w) = 1 - H(w)e^{\wedge}(-jw\tau_f) = (1-H(w))+H(w)(1-e^{\wedge}(-jw\tau_f)) \quad (8)$$

where H(w) is 1 when w is within a range of $w_c \pm \Delta w_c$, but H(w) is 0 in any other case. And $\tau_f$ can be expressed as follows by modifying Eq. (7).

$$\tau_f = n\tau_c(1-(\Delta w_c/w_c) \cdot COS\, pt)$$

Figure 6:
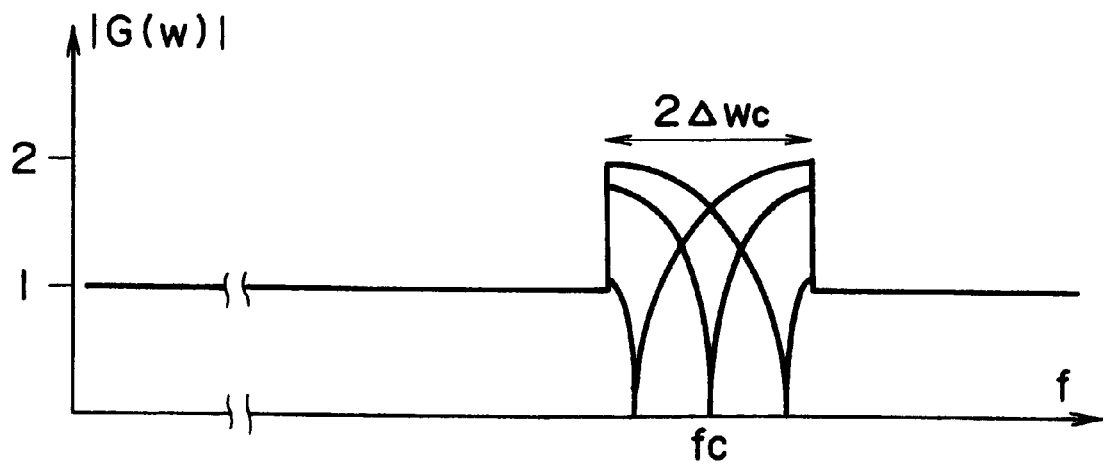

When the delay signal has a band characteristic H(w), a comb trap is obtained only within a band where H(w)=1 (i.e., within a range where $w = w_c \pm \Delta w_c$), as shown in FIG. 6. For example, in the case of band-limiting the delay signal by means of a band pass filter or utilizing the output of a VCO in a PLL as a new delay signal, the signal is boosted by a maximum of 6dB at a frequency of $f_c \pm 1/(2\tau_f)$ in the correlated state where the delay signal has the band characteristic H(w).

Actually the demodulated signal for driving the variable delay circuit 32 is delayed, due to the demodulation, from the signal in the main line. Therefore, if a comb filter is so formed as shown in FIG. 3, the phases of the two inputs to the subtracter 21 are deviated from an ideal state thereof to consequently fail in achieving exact trapping. In regard to the demodulation delay time $\tau_d$, the remaining component (residual level) left untrapped will now be found below by an approximation. As described above, the instantaneous angular frequency $w_i$ of the FM signal is represented by the following equation.

$$w_i = w_c + \Delta w \cdot \text{COS } pt \quad (9)$$

The trap delay time $\tau_f$ of the delay circuit 22 is expressed as follows with insertion of t−τd into Eq. (7).

$$\tau_f = \tau - \tau_a \cdot \text{COS } p(t-\tau_d) \approx \tau - \tau_a \cdot \text{COS } pt - \tau_a \cdot P \cdot \tau_d \cdot \text{SIN } pt \quad (10)$$

where $p \cdot \tau_d \ll 1$.

The following equation is obtained by normalizing Eq. (2) to 1 and inserting Eqs. (9) and (10) therein.

$$|\text{SIN}w_i \cdot \tau_f / 2| = |\text{SIN}((w_c + \Delta w \cdot \text{COS } pt) \times \quad (11)$$
$$(\tau - \tau_a \text{COS } pt - \tau_a \cdot p \cdot \tau_d \text{SIN} pt)/2)|$$
$$\approx |\text{SIN}n\pi(1-p) \cdot \tau_d \cdot (\Delta w / w_c) \cdot \text{SIN pt}|$$
$$\approx n\pi \cdot p \cdot \tau_d (\Delta f / f_c) \cdot |\text{SIN} pt| \text{ (radian)}$$

where $\Delta w / w_c = \Delta f / f_c \ll 1$.

When the shift of the variable delay is not coincident with that of the FM signal, i.e., when any trap frequency deviation exists, the FM signal is slope-detected to consequently include an AM component therein. And if the FM signal includes any AM component, there appears relatively conspicuous horizontal streak noise on the picture obtained by demodulating such FM signal. In an exemplary system of FIG. 10, the demodulation delay time $\tau_d$ is dominated by the group delay of a band pass filter which separates and extracts the FM signal (e.g., AFM sgnal), and it is approximately equal to $n\tau_c$.

Under the conditions of $\tau_d = 3.3 \mu s$ (n=5), $f_c = 1.5$ MHz and $\Delta f = \pm 100$ kHz, the amplitude characteristics $|G(w)|$ at frequencies of 1 kHz, 5 kHz, 10 kHz and 20 kHz are calculated as follows according to Eq. (11).

| | |
|---|---|
| 1 kHz | −33.26 dB |
| 5 kHz | −19.12 dB |
| 10 kHz | −13.27 dB |
| 20 kHz | −7.25 dB |

As obvious from the results of such calculations, relatively great attenuation is attained at the frequencies of 1 kHz, 5 kHz and 10 kHz, whereas the trapping effect is no so satisfactory for the modulated signal of 20 kHz. However, considering that the above result is obtained when the frequency deviation is maximum, it is supposed that substantially no problem arises since the frequency deviation rarely becomes maximum in any of general sound sources.

Viewing Eq. (10), a third term is generated as a new delay term (term of residual level). The value of this term is proportional to the result of differentiating the modulated signal (temporal change of modulated signal). Therefore, the residual level can be reduced by adding (subtracting) the variable delay component, which is controlled by the differentiated modulated signal, to (from) the FM signal in reverse polarity. That is, as represented by Eq. (12) below, a new delay time $\tau_f$ is set by adding a delay time, which corresponds to the differentiated modulated signal component, to the trap delay time $\tau_f$ of Eq. (10).

$$\tau_f \approx \tau - \tau_a \cdot \text{COS } pt - \quad (12)$$
$$\tau_a \cdot p \cdot \tau_d \cdot \text{SIN} pt + \tau_a \cdot p \cdot \tau_d \cdot \text{SIN} p(t-\tau_d)$$
$$\approx \tau - \tau_a \cdot \text{COS } pt - \tau_a \cdot p \cdot \tau_d (\text{SIN} pt - \text{SIN} p(t-\tau_d))$$
$$\approx \tau - \tau_a \cdot \text{COS } pt - (\tau_a (p \cdot \tau_d))^2 \cdot \text{COS} p(t-\tau_d/2)$$

In above, $p \cdot \tau_d \ll 1$, and $\Delta w / w_c \ll 1$.

Comparing the approximated result of Eq. (12) with Eq. (10), it is seen that the coefficient of the third term is multiplied by $p \cdot \tau_d$, so that simply an improvement of 20 Log $(p \cdot \tau_d)$ is achieved. Consequently, the amplitude characteristic $|G(w)|$ becomes about −27 dB at 10 kHz or about −15 dB at 20 kHz.

The trap delay time $\tau_f$ with the demodulation delay time $\tau_d$ taken into consideration is represented by Eq. (13) below where the differentiated modulated signal component $$\tau_a \cdot p \cdot \tau_d \cdot \text{SIN } p(t-\tau_d)$$

added in Eq. (12) is further added to $$\tau_f = \tau - \tau_a \cdot \text{COS } p(t-\tau_d) \text{ of Eq. (10)}.$$

$$\tau_f = \tau - \tau_a \cdot \text{COS } p(t-\tau_d) + \tau_a \cdot p \cdot \tau_d \cdot \text{SIN } p(t-\tau_d) \quad (13)$$

Figure 7:
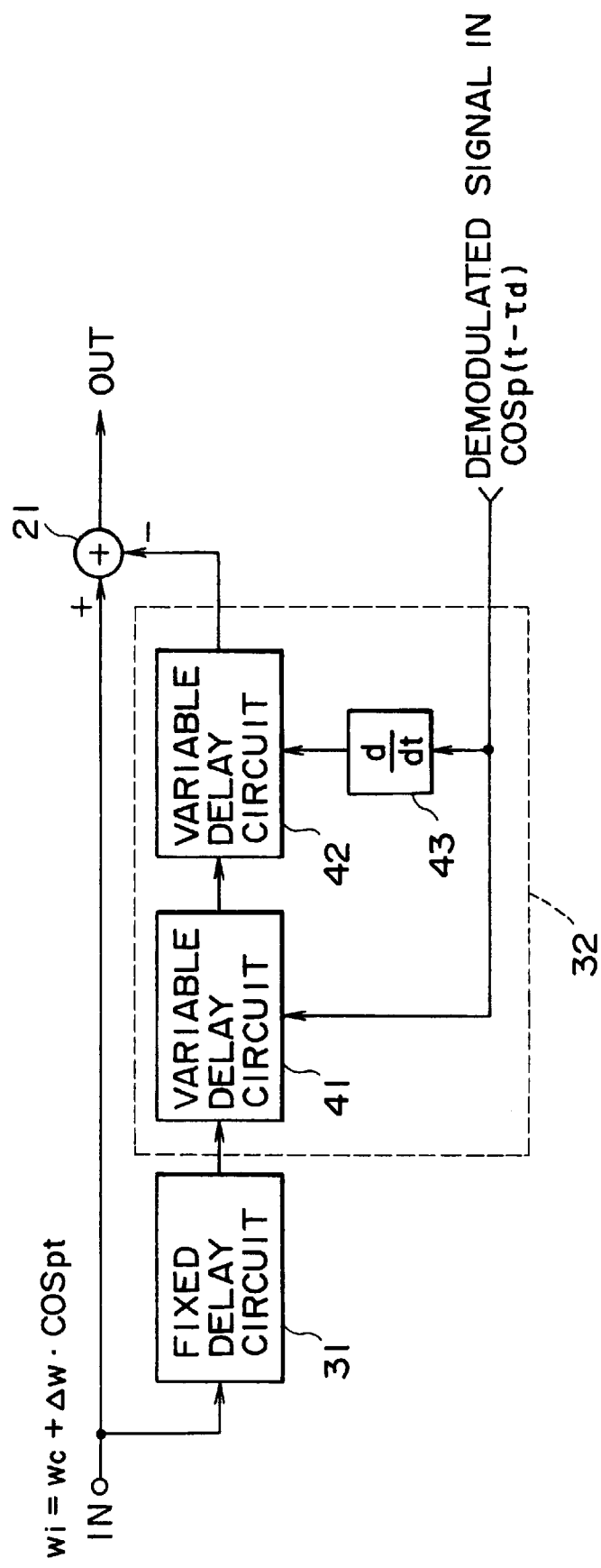
FIG. 7 shows another structural example of a comb filter constituting the signal trap device of the present invention.

FIG. 7 shows a structural example for obtaining the trap delay time $\tau_f$ which corresponds to Eq. (13). In the embodiment shown in this diagram, a variable delay circuit 32 consists of variable delay circuits 41, 42 and a differential circuit 43. An FM signal outputted from a fixed delay circuit 31 is delayed in the variable delay circuit 41 in response to a demodulated signal (COS $p(t-\tau_d)$), whereby a calculation is executed for the second term of Eq. (13). In this equation, $\tau_a$ denotes a coefficient in the variable delay circuit 41.

In the variable delay circuit 42, the FM signal supplied from the variable delay circuit 41 is further delayed in response to the output of the differential circuit 43, i.e., a signal (pSIN p $(t-\tau_d)$) produced by differentiating the demodulated signal, whereby a calculation is executed for the third term of Eq. (13). In this equation, $\tau_a \cdot \tau_d$ denotes a coefficient in the variable delay circuit 42. The output of the variable delay circuit 42 is supplied to a subtracter 21 to be subtracted from the non-delayed FM signal.

Therefore, according to the comb filter shown in FIG. 7, it is possible to suppress the residual level as well to sufficiently attenuate any unrequired AFM component.

Eq. (13) may be rewritten as follows.

$$\tau_f = \tau - \tau_a (\text{COS } p(t-\tau_d) - p \cdot \tau_d \cdot \text{SIN } p(t-\tau_d)) \quad (14)$$

Figure 8:
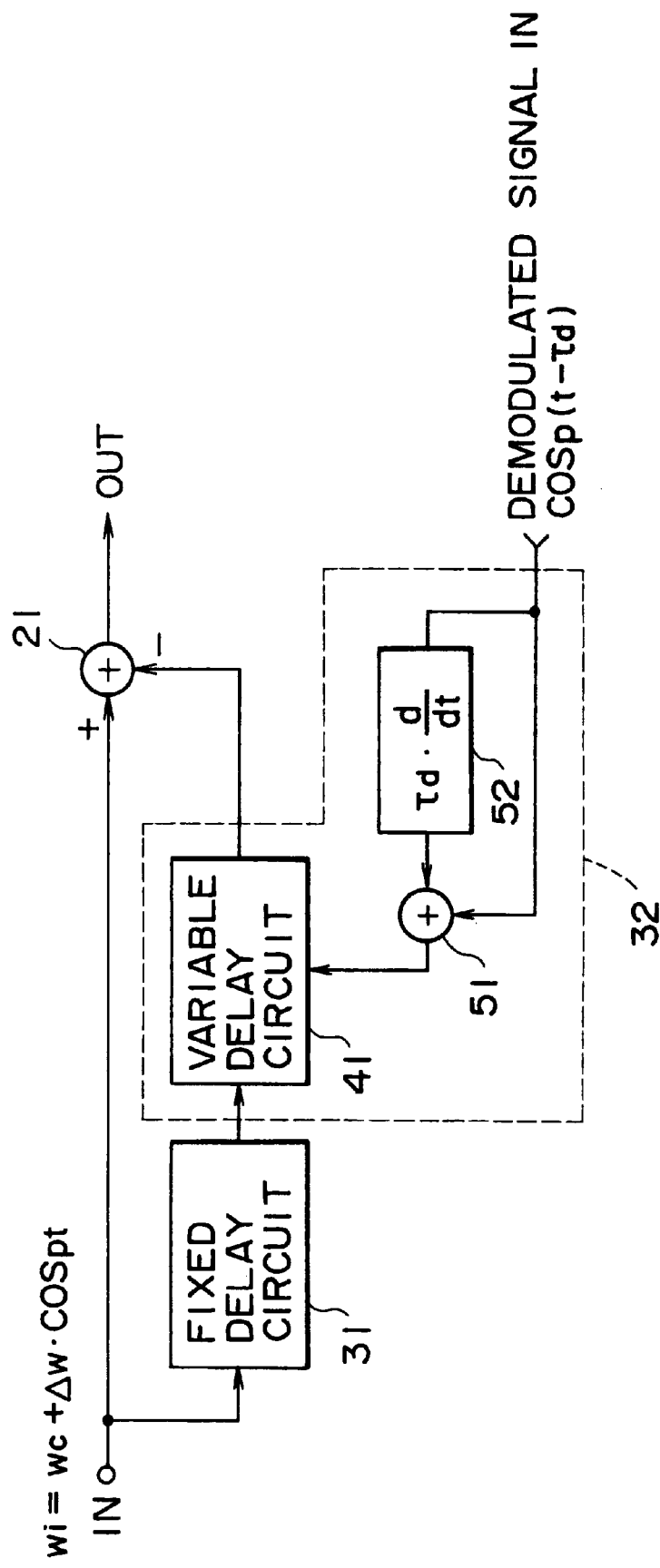
FIG. 8 shows a further structural example of a comb filter constituting the signal trap device of the present invention.

FIG. 8 shows a structural example of a comb filter contrived for obtaining the trap delay time $\tau_f$ which corresponds to Eq. (14). In this embodiment, the variable delay circuit 42 employed in the foregoing embodiment of FIG. 7 is omitted, and instead a control signal is produced by adding, in an adder 51, the demodulated signal and the signal calculated through multiplication of a time $\tau_d$ by the value obtained by differentiating the demodulated signal in a differential circuit 52, and then such control signal is supplied to a variable delay circuit 41. Subsequently in the variable delay circuit 41, the FM signal inputted from a fixed delay circuit 31 is delayed in response to the control signal and then is supplied to a subtracter 21. The other structure is the same as that in the aforementioned embodiment of FIG. 7.

In the variable delay circuit 41 in the embodiment of FIG. 8, the FM signal inputted from the fixed delay circuit 31 is delayed by a time corresponding to the sum of the delay time of the variable delay circuit 41 in FIG. 7 and the delay time of the variable delay time 42, and the signal thus delayed is outputted to the subtracter 21. Therefore, the same effect as in the foregoing embodiment of FIG. 7 is achievable in this embodiment also. It signifies that the requirement can be satisfied by boosting the higher-frequency component of the demodulated signal and inputting the same to the variable delay circuit 41.

FIG. 9 shows a structural example of an 8 mm-tape video cassette recorder where an input signal is separated into an AFM signal and a YFM signal according to the principle mentioned above.

In a record/replay block 61 in this embodiment, a replay RF signal reproduced from a video cassette tape 20 is equalized in an MT (middle tune) gain amplifier 91 and then is outputted therefrom. Further in the record/replay block 61, a replay YFM signal inputted via a terminal 92 is adjusted to a predetermined level in an AGC amplifier 93 and then is outputted via a terminal 94 to a YFM signal demodulation circuit 95.

The signal outputted from the MT gain amplifier 91 in the record/replay block 61 is supplied to a band pass filter 71 where a 1.5-MHz frequency component (AFM signal) is separated, and also to a band pass filter 72 where a 1.7-MHz frequency component (AFM signal) is separated. The output of the band pass filter 71 is supplied to a PLL-type FM detection circuit 101 in an AFM block 62 while being inputted to a variable delay circuit 74 via a delay adjust circuit 73. The output of the variable delay circuit 74 is inputted to a subtracter 76 via a level adjust circuit 75. Similarly, the output of the band pass filter 72 is supplied to a PLL-type FM detection circuit 104 while being inputted to a variable delay circuit 78 via a delay adjust circuit 77. The output of the variable delay circuit 78 is inputted to a subtracter 80 via a level adjust circuit 79. The delay adjust circuits 73 and 77 serve to adjust the delay times in the respective delay lines in such a manner that the time difference between the two inputs in the subtracters 76 and 89 is maintained at a predetermined value ($n\tau_c$).

In the subtracter 76, the output of the level adjust circuit 75 is subtracted from the replay FM signal outputted from the MT gain amplifier 91 in the record/replay block 61 and then is supplied to the subtracter 80. Subsequently in the subtracter 80, the signal inputted from the level adjust circuit 79 is subtracted from the signal supplied from the subtracter 76 and then is outputted to an ATF trap circuit 85. Thereafter in the ATF trap circuit 85, the ATF signal included in the input signal is trapped and outputted to a chroma low pass filter 96 and a chroma trap circuit 86.

In the chroma low pass filter, a chroma component is extracted from the input signal and then is outputted to a chroma signal processing circuit 97.

In the chroma trap circuit 86, the chroma component in the input signal is trapped and outputted to an RF equalizer/low pass filter 87. Subsequently in the filter 87, the input signal is equalized and, after extraction of the YFM signal component, this signal component is outputted to a terminal 92 of the record/replay block 61.

The output of an FM detection circuit 101 in an AFM block 62 is supplied to a deemphasis noise reduction circuit 102 to be deemphasized therein and, after being expanded for noise reduction, the processed signal is outputted to a multiplexer 103. Similarly, the output of an FM detection circuit 104 is supplied to a deemphasis noise reduction circuit 105 to be deemphasized therein, and then the signal is expanded for noise reduction. Subsequently the processed signal is outputted to a multiplexer 103, where the outputs of the two deemphasis noise reduction circuits 102 and 105 are multiplexed so that a left (L) channel audio component and a right (R) channel audio component are outputted.

The output of the FM detection circuit 101 is supplied also to a low pass filter 81 where the low-frequency component thereof is extracted, and then the extracted component is supplied, as a control signal for controlling the delay time, to a variable delay circuit 74 via a variable delay range adjust circuit 82 which adjusts the variable delay range to a predetermined value.

Similarly, the output of the FM detection circuit 104 is supplied also to a low pass filter 83 where the low-frequency component thereof is extracted, and then the extracted component is supplied, as a control signal for controlling the delay time, to a variable delay circuit 78 via a variable delay range adjust circuit 84 which adjusts the variable delay range to a predetermined value.

Thus, in this embodiment, the control signals for controlling the respective delay times in the variable delay circuits 74 and 78 are produced from the signals prior to being processed in the deemphasis noise reduction circuits 102 and 105.

If the control signals for the variable delay circuits 74 and 78 are produced by using the signals after the processes of deemphasis and expansion for noise reduction, it becomes difficult to trap the AFM signal exactly because, since the modulated signal included in the AFM signal supplied from the MT gain amplifier 91 to the subtracters 76 and 80 is the signal prior to being deemphasized and expanded for noise reduction (i.e., the signal emphasized and compressed for noise reduction), this signal is not coincident with the signal deemphasized and expanded. For the above reason, the control signals are produced from the outputs of the FM detection circuits 101 and 104 (i.e., inputs to the deemphasis and noise reduction circuits 102 and 105).

Next, an explanation will be given on the operation performed in the embodiment of FIG. 9. The RF signal reproduced from the video cassette tape 20 is supplied to the MT gain amplifier 91 where its replay level is adjusted, and subsequently the level-adjusted RF signal is outputted therefrom. In the band pass filters 71 and 72, the 1.5 MHz carrier component and the 1.7 MHz carrier component are extracted respectively. The group delay characteristic of the band pass filters 71 and 72 functions as the fixed delay circuit 31 in FIG. 7. Thereafter the output of the band pass filter 71 is PLL-detected in the FM detection circuit 101, and an (L+R) signal is outputted as a demodulated signal to the deemphasis noise reduction circuit 102, where the input (L+R) signal is deemphasized and expanded for noise reduction, and then the processed signal is outputted to the multiplexer 103.

The input AFM signal is PLL-detected in the FM detection circuit 104, and an (L−R) signal is outputted therefrom as a demodulated signal. In the deemphasis noise reduction circuit 105, the (L−R) signal is deemphasized and expanded for noise reduction, and then the processed signal is outputted to the multiplexer 103. Subsequently in the multiplexer 103, the input (L+R) and (L−R) signals from the deemphasis noise reduction circuits 102 and 105 are multiplexed and separated into the L signal and the R signal, which are then outputted therefrom.

The (L+R) signal (modulated signal) outputted from the FM detection circuit 101 is smoothed by the low pass filter 81 and then is inputted to the variable delay range adjust circuit 82, where the signal is converted into a control signal of a predetermined value within the variable delay range adjusted previously, and the control signal is supplied to the variable delay circuit 74. Similarly, the (L−R) signal outputted from the FM detection circuit 104 is smoothed by the low pass filter 83 and then is converted into a control signal of a predetermined value within the variable delay range, and this control signal is supplied to the variable delay circuit 78.

In the delay adjust circuits 73 and 77, the AFM signals outputted from the band pass filters 71 and 72 are delayed by a predetermined time so that the trap delay time in the entire delay line becomes equal to a predetermined delay time, and thereafter the delayed signals are outputted to the variable delay circuits 74 and 78. Subsequently the AFM signals supplied from the delay adjust circuits 73 and 77 are delayed in the variable delay circuits 74 and 78 in response to the control signals inputted respectively from the variable delay range adjust circuits 82 and 84, and then the delayed AFM signals are outputted.

The signals thus outputted from the variable delay circuits 74 and 78 are supplied respectively to the level adjust circuits 75 and 79 where the levels are adjusted for cancellation, and then the level-adjusted signals are supplied to the subtracters 76 and 80 respectively. In the subtracter 76, the AFM signal supplied from the level adjust circuit 75 is subtracted from the RF signal (frequency multiplexed signal) outputted from the MT gain amplifier 91 in the record/replay block 61, whereby the AFM signal of 1.5 MHz is trapped. Meanwhile in the subtracter 80, the output of the level adjust circuit 79 is subtracted from the output of the subtracter 76, whereby the AFM signal of 1.7 MHz is trapped.

The output of the subtracter 80 is supplied to the ATF trap circuit 85 where the ATF signal is trapped. As described with reference to FIG. 29, the ATF signal is sufficiently lower in frequency than the low-frequency converted chroma signal and the YFM signal of a higher frequency band. Therefore the ATF signal can be completely trapped by an ordinary LC tuning trap circuit. Consequently, the output of the ATF trap circuit 85 is turned to a signal obtained by removing the AFM signal and the ATF signal from the RF signal which is reproduced from the video cassette tape 20.

Figure 29:
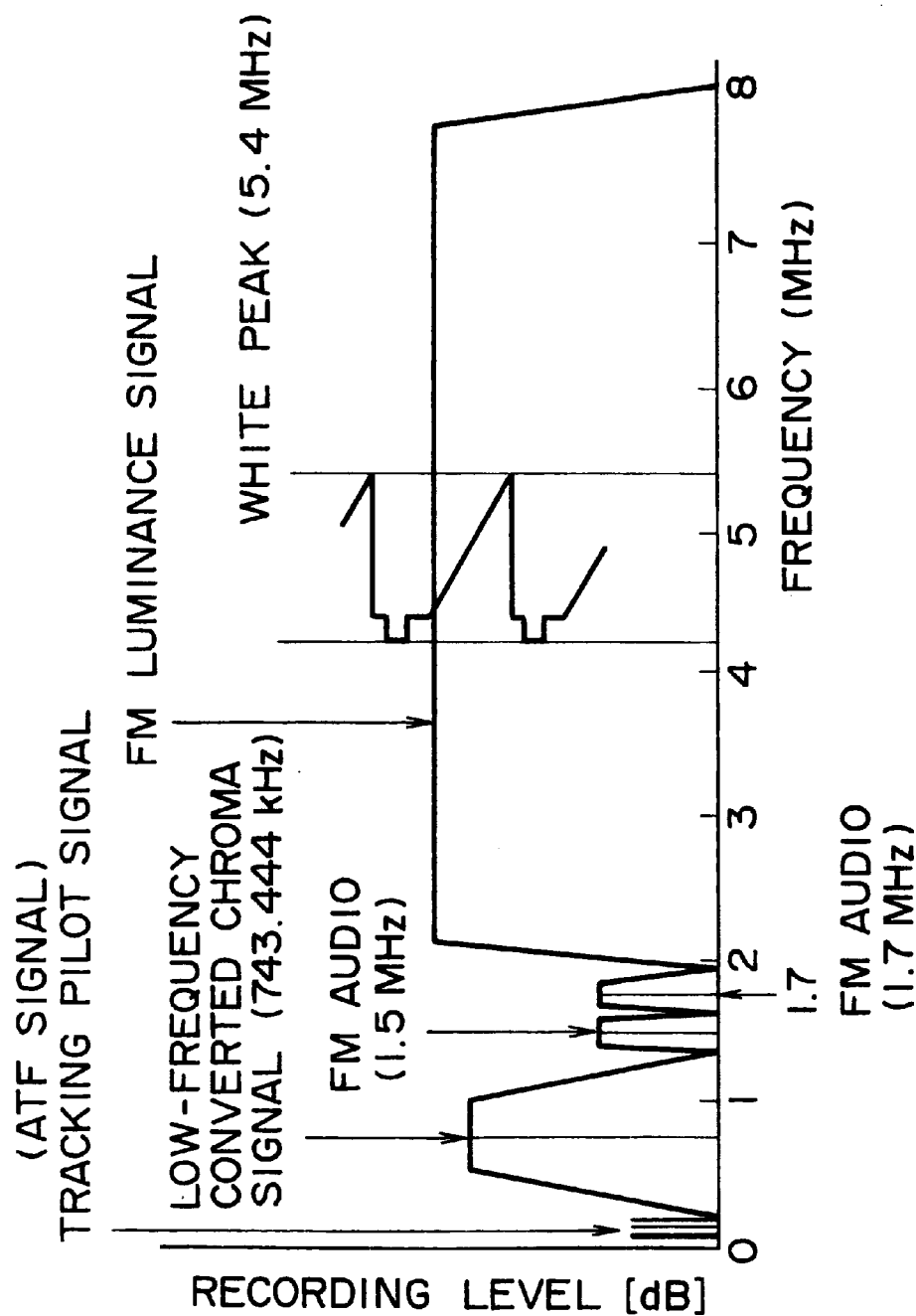
FIG. 29 is a graphic diagram for explaining the spectrum of signals recorded by the 8 mm tape system.
Figure 30A:
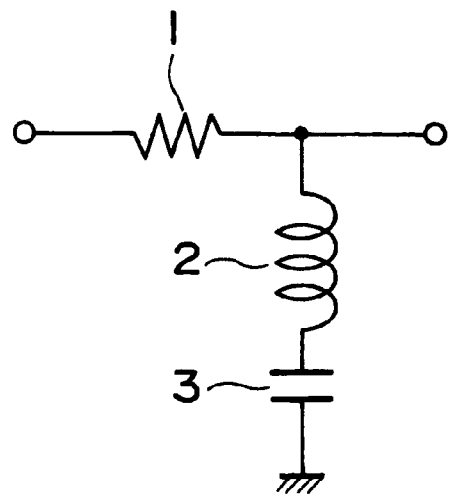
FIGS. 30A and 30B are circuit diagrams showing structural examples of conventional LC tuning type trap circuits in the related art.
Figure 30B:
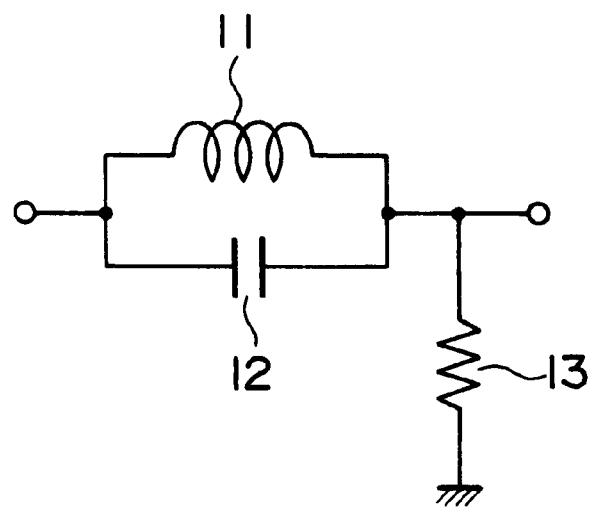
Figure 31:
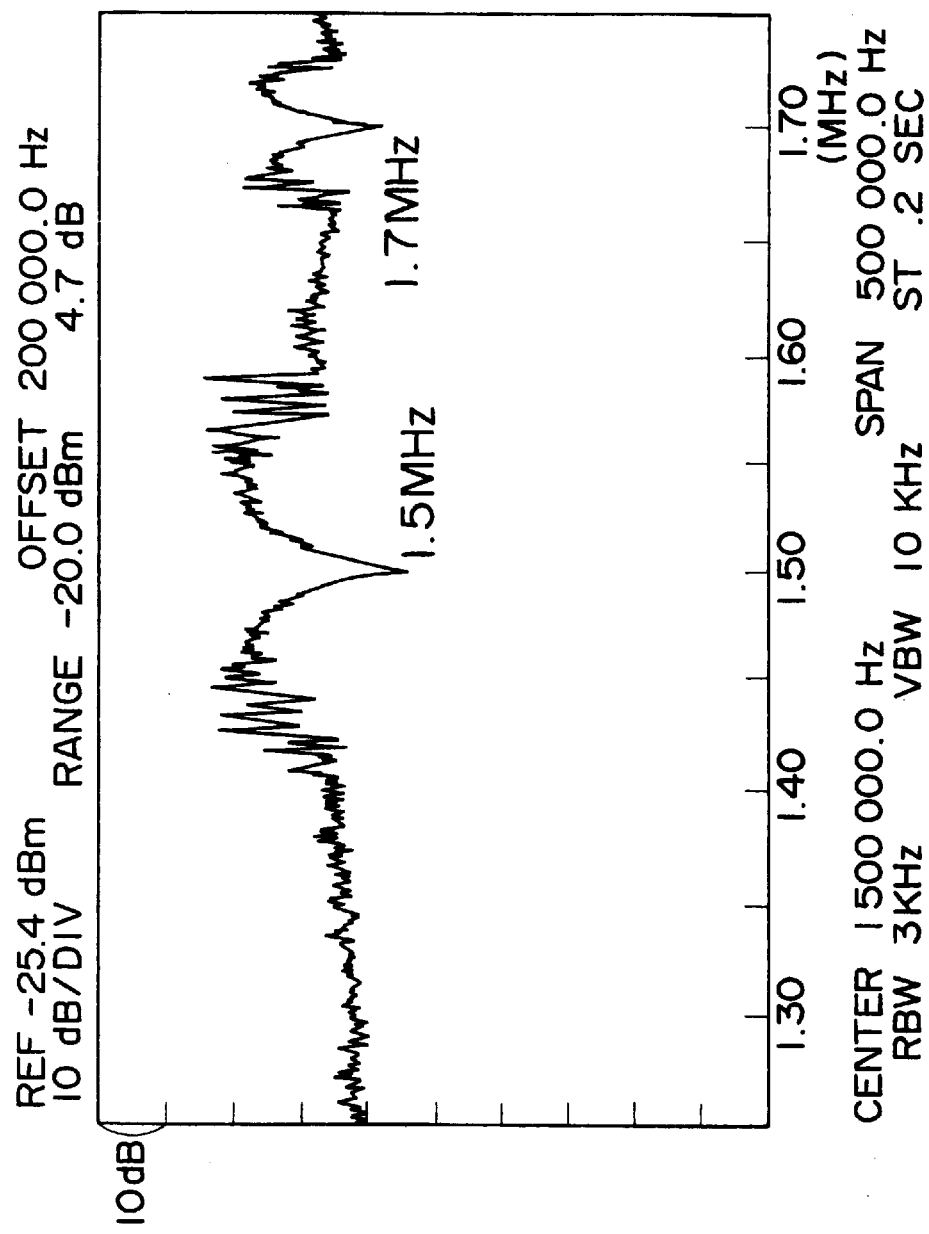
FIG. 31 graphically shows the output characteristic obtained in a fixed delay processing mode.

In the chroma low pass filter 96, the low-frequency converted chroma signal of 743.444 kHz is extracted from the signal inputted from the ATF trap circuit 85 and then is outputted to the chroma signal processing circuit 97. Since the frequency of the low-frequency converted chroma signal is sufficiently spaced apart from the frequency of the YFM signal as shown in FIG. 29, the chroma signal alone can be extracted by the chroma low pass filter 96. Such chroma signal is processed in and outputted from the chroma signal processing circuit 97.

In the chroma trap circuit 86, the low-frequency converted chroma signal component of 743.444 kHz is trapped out of the signal inputted from the ATF trap circuit 85. Since the frequency of the converted chroma signal is sufficiently spaced apart from the frequency of the YFM signal as mentioned above, the chroma trap circuit 86 may be composed of an ordinary LC tuning trap circuit.

In this manner, the signal outputted from the chroma trap circuit 86 is turned to a signal obtained by removing the ATF signal, the low-frequency converted chroma signal and the AFM signal from the RF signal reproduced from the cassette tape 20, i.e., to the YFM signal alone. This YFM signal is inputted to the RF equalizer/low pass filter 87, where the signal is equalized and then any unrequired high-frequency component is removed. Thereafter the output of the RF equalizer/low pass filter 87 is supplied via the terminal 92 to the record/replay block 61, where the level is adjusted in the AGC amplifier 93 and then the level-adjusted signal is outputted via the terminal 94 to the demodulation circuit 95. The input YFM signal is demodulated in the circuit 95, and the demodulated signal is outputted therefrom as a luminance signal to an unshown circuit.

In the embodiment of FIG. 9, the subtracters 76 and 80 are disposed anterior to the AGC amplifier 93 which adjusts the level (AGC) of the YFM signal. Therefore, even if any level variations are existent in the AFM signal, such variations in the two inputs to the subtracters 76 and 89 have values corresponding to each other, whereby the variations can be absorbed. Further, the process of trapping the AFM signal is executed in a common line to the YFM signal and the chroma signal (in the stage including both signals), so that the effect of improving the frequency band can be efficiently achieved with regard to the chroma signal as well as to the YFM signal.

Hereinafter an explanation will be given on a structural example where the comb filter shown in FIG. 7 or 8 is applied to the embodiment of FIG. 9. As shown in FIG. 9, two comb filters are required for trapping the AFM signals, i.e., a circuit for trapping the AFM signal of 1.5 MHz and a circuit for trapping the AFM signal of 1.7 MHz. However, since the fundamental configurations of such two circuits are mutually the same, a description will be given below merely on one comb filter for trapping the AFM signal of 1.5 MHz.

FIG. 10 shows a first example of applying such a comb filter. In this embodiment, a replay signal outputted from an MT gain amplifier 91 in a record/replay block 61 is supplied directly to a subtracter 76 while being supplied via a band pass filter 71 and a variable delay circuit 74 to the subtracter 76. An AFM signal of 1.5 MHz extracted by the band pass filter 71 is supplied to a phase comparator 111 which constitutes a PLL circuit in an FM detection circuit 101. In the phase comparator 111, the phase of the output signal from a VCO (voltage-controlled oscillator) 113 is compared with the phase of the output signal from the band pass filter 71, and a phase error signal representing the phase difference therebetween is delivered. A low pass filter 112 smooths the phase error signal outputted from the phase comparator 111 and then supplies the smoothed signal to the VCO 113. The output of the low pass filter 112 is supplied as a demodulated signal (L+R signal) of the AFM signal to a deemphasis noise reduction circuit 102 while being supplied as a control signal to a variable delay circuit 74.

In this embodiment, a signal synchronized with the output AFM signal from the band pass filter 71 is generated by the VCO 113 which constitutes a PLL in combination with the phase comparator 111 and the low pass filter 112. Accordingly, the output of the low pass filter 112 becomes a demodulated signal of the AFM signal. This demodulated signal is supplied as a control signal to the variable delay circuit 74, and the AFM signal outputted from the band pass filter 71 is delayed by a time corresponding to such control signal and then is supplied to the subtracter 76. Subsequently in the subtracter 76, the output of the variable delay circuit 74 is subtracted from the output signal of the MT gain amplifier 91 to thereby trap the AFM signal.

Figure 11:
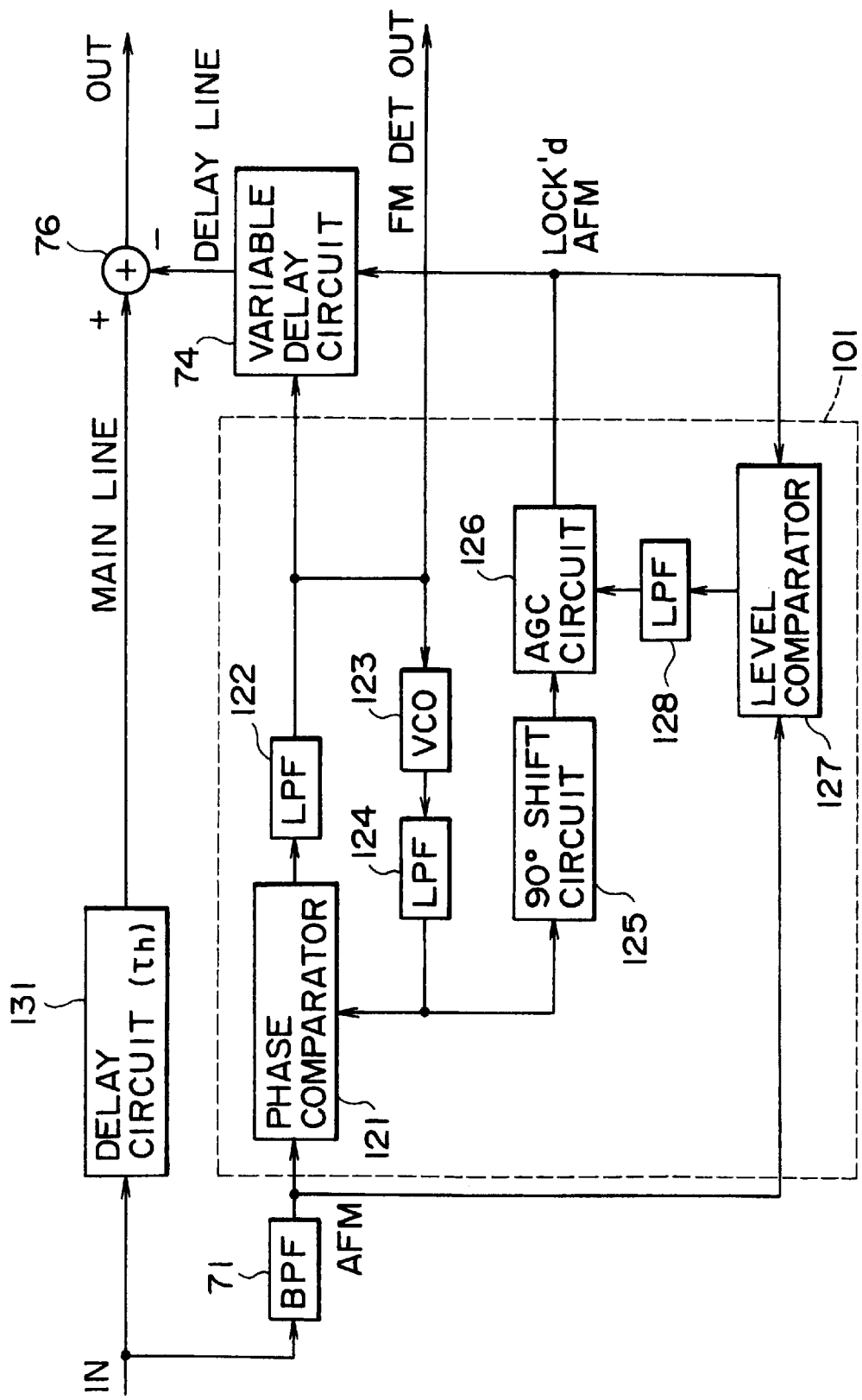
FIGS. 11 to 13 are block diagrams showing other structural examples of the comb filter for use in the embodiment of FIG. 9.

FIG. 11 shows a second example of applying the above comb filter. In this example, the replay signal is delayed not only in the delay line but also in the main line in such a manner that the signal is delayed by a time $\tau_h$ in a delay circuit 131 and then is supplied to a subtracter 76. The following relationship is existent between the delay time $\tau_d$ in the delay line and the delay time rh in the main line.

$\tau_h - \tau_d = n\tau_c$ $(n=0, 1, 2, 3, \ldots)$

In any case except when n=0 ($\tau_h = \tau_d$), variable delay needs to be executed in the variable delay circuit 74. In the case of this example, an FM detection circuit 101 is so formed that an AFM signal outputted from a band pass filter 71 is FM-detected in a PLL circuit which consists of a phase comparator 121, a low pass filter 122, a VCO 123 and a low pass filter 124. The FM detection signal (L+R signal) outputted from the low pass filter 122 is supplied to a deemphasis noise reduction circuit 102 while being supplied also to a variable delay circuit 74.

The output of the VCO 123 is smoothed by the low pass filter 124 and then is supplied to the phase comparator 121 while being supplied also to a 90° shift circuit 125. When a signal phase-locked to the output AFM signal from the band pass filter 71 is generated in the VCO 123, this signal has a phase shift of 90° from the AFM signal. Therefore, the phase is shifted by 90° to resume an in-phase state with regard to the output AFM signal of the band pass filter 71, and this signal is supplied to an AGC circuit 126.

Subsequently in the AGC circuit 126, the level of the signal inputted from the 90° shift circuit 125 is controlled in response to the signal supplied from a low pass filter 128, and the level-controlled signal is outputted as a locked AFM signal to a variable delay circuit 74 and a level comparator 127. Then the level of the output AFM signal from the band pass filter 71 and the level of the locked AFM signal from the AGC circuit 126 are compared with each other in the level comparator 127, and an error signal representing the level difference therebetween is outputted. This error signal is smoothed by a low pass filter 128 and then is inputted as a control signal to the AGC circuit 126.

Thus, in this example, the locked AFM signal outputted from the AGC circuit 126 corresponds in both phase and level to the AFM signal outputted from the band pass filter 71. In the variable delay circuit 74, the locked AFM signal supplied from the AGC circuit 126 is delayed in response to the control signal supplied from the low pass filter 122, and the delayed signal is outputted to a subtracter 76.

In the embodiment of FIG. 11, the 90° shift circuit 125 is provided between the low pass filter 125 and the AGC circuit 126. However, the shift circuit 125 may be disposed between the band pass filter 71 and the phase comparator 121, or between the low pass filter 124 and the phase comparator 121.

Figure 12:
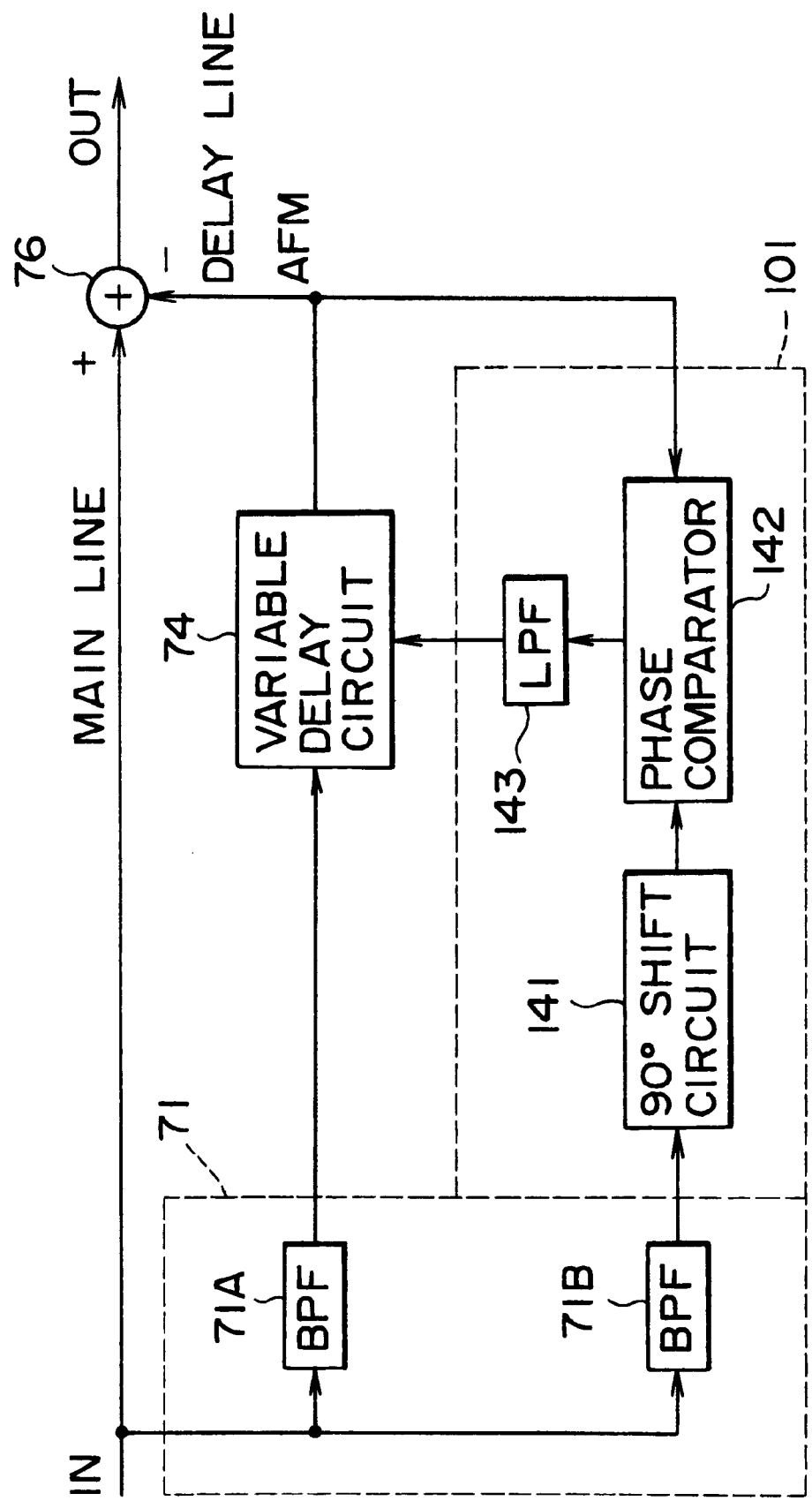

FIG. 12 shows a third example of applying the comb filter. In this embodiment, a band pass filter 71 consists of a band pass filter 71A set to the bandwidth of an AFM signal of 1.5 MHz and a band pass filter 71B. The output of the band pass filter 71A is supplied to a variable delay circuit 74 to be delayed by a predetermined time therein, and then the delayed signal is supplied to a subtracter 76.

Meanwhile the output of the band pass filter 71B is supplied to a phase comparator 142 via a 90° shift circuit 141 in an FM detection circuit 101. In the phase comparator 142, the phase of the output from the 90° shift circuit 141 is compared with the phase of the output from the variable delay circuit 74, and a phase error signal representing the phase difference therebetween is supplied as a control signal to the variable delay circuit 74 via a low pass filter 143.

The delay time resulting from the output signal of the band pass filter 71B needs to be $\tau_c$ or an integral multiple thereof. A PLL in the FM detection circuit 101 is phase-locked in a relationship that the time difference between a main line and a delay line is $n\tau_c$.

More specifically, in the phase comparator 142, the phase of a signal obtained by 90° phase-shifting the output of the band pass filter 71B in the 90° shift circuit 141 is compared with the phase of the output from the variable delay circuit 74, and a phase error signal representing the phase difference therebetween is outputted. The output from the variable delay circuit 74 serves to delay the AFM signal, which is outputted from the band pass filter 71A, in response to a control signal produced by smoothing, through the low pass filter 143, the phase error signal outputted from the phase comparator 142. Consequently, the delay time of the AFN signal outputted from the variable delay circuit 74 is so adjusted that this signal is synchronized in phase with the AFM signal included in the RF signal.

In the example of FIG. 12, the 90° shift circuit 141 is disposed between the band pass filter 71B and the phase comparator 142. However, this shift circuit 141 may be disposed between the variable delay circuit 74 and the phase comparator 142.

Figure 13:
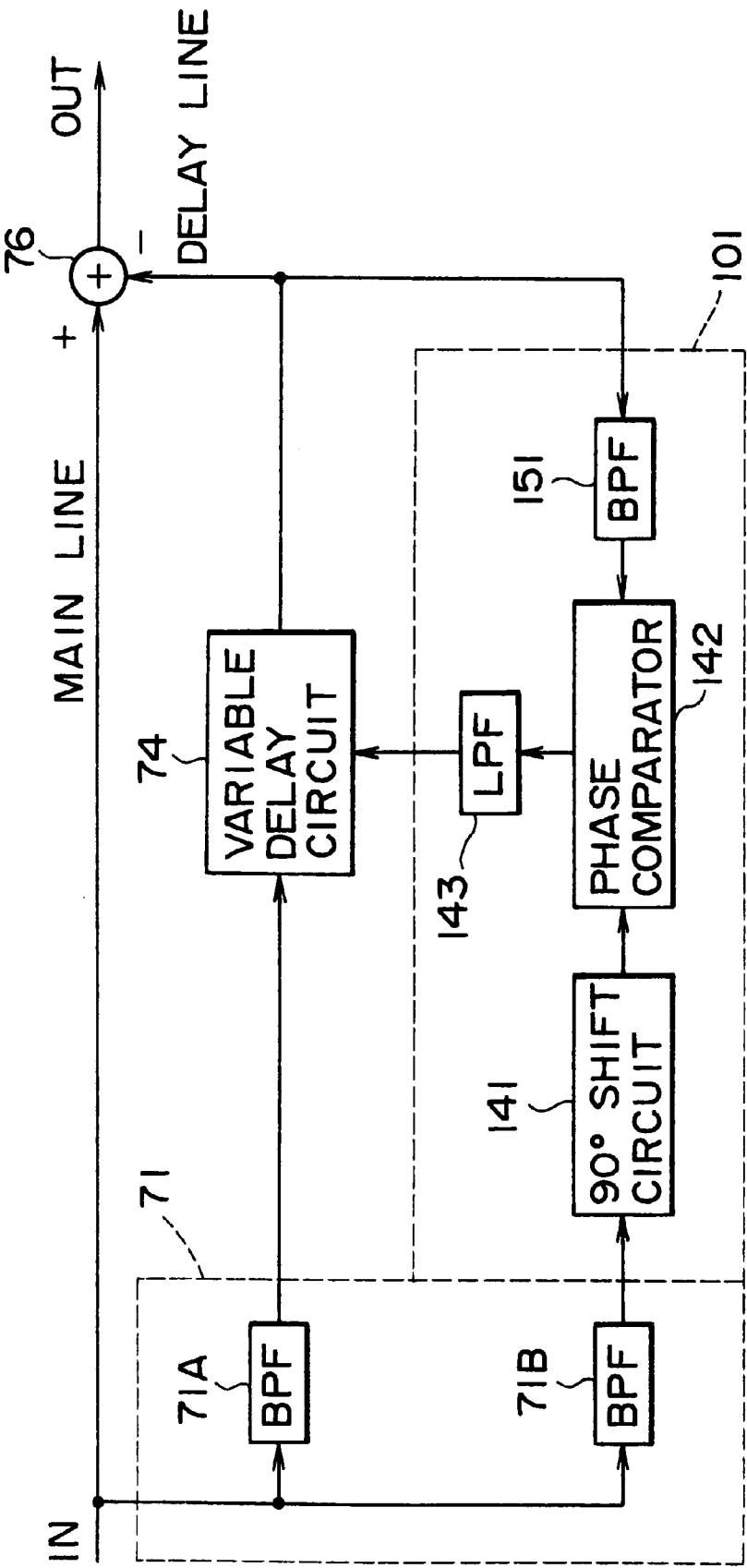

FIG. 13 shows a fourth example of applying the comb filter. The configuration of this example is such that a band pass filter 151 is additionally provided between the variable delay circuit 74 and the phase comparator 142 employed in the foregoing example of FIG. 12. The band pass filter 151 may consist of the same as the band pass filter 71B. The other structure is the same as that in FIG. 12.

The operation performed in this example is fundamentally the same as in the foregoing embodiment of FIG. 12. However, in the example of FIG. 13, it is not necessary to set the delay time to n$\tau$c in each of the band pass filters 71B and 151.

In this example, a 90° shift circuit 141 is disposed between the band pass filter 71B and the phase comparator 142. However, it may be disposed between the band pass filter 151 and the phase comparator 142.

Figure 14:
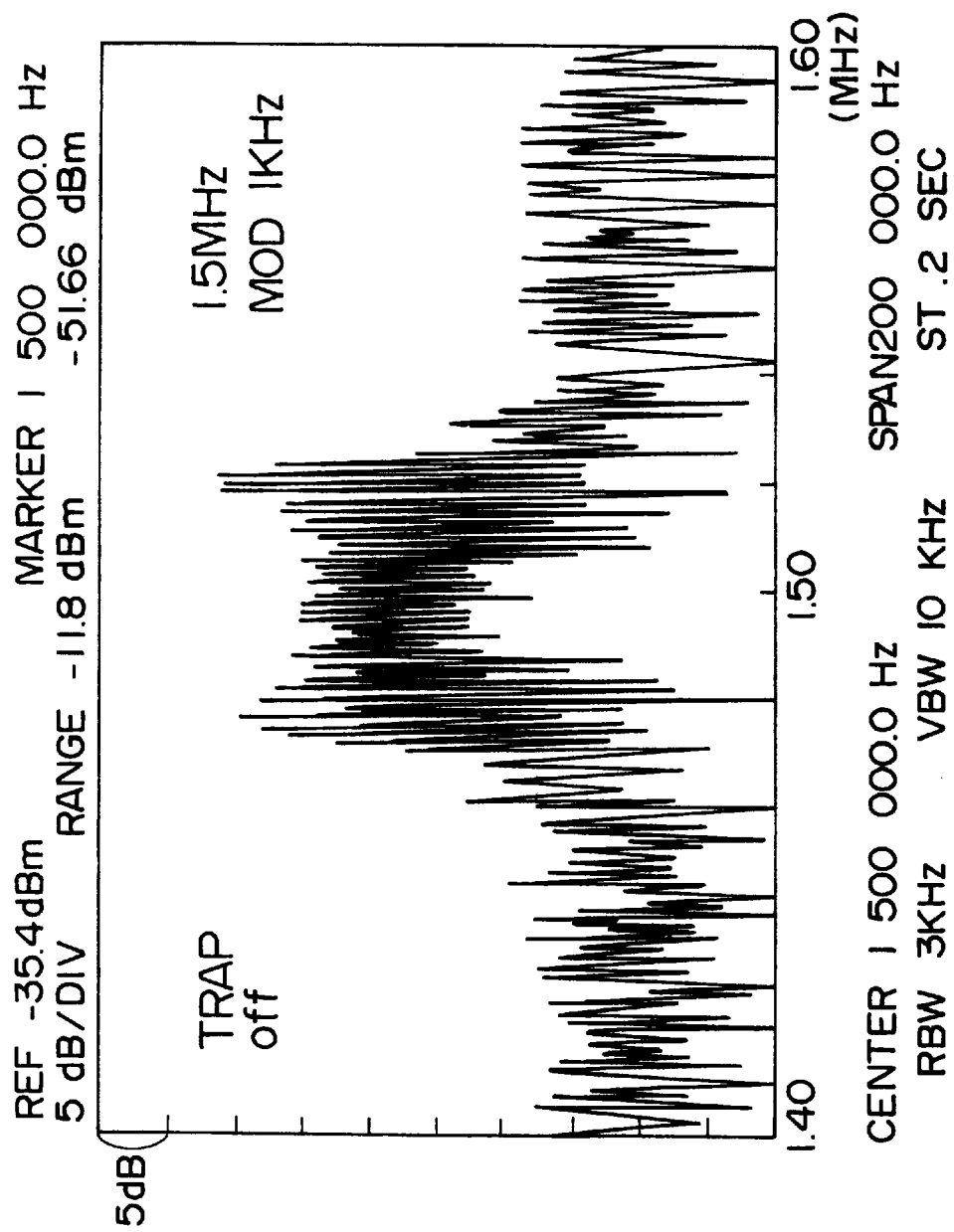
FIGS. 14 to 19 graphically show the output characteristics of the comb filter.
Figure 15:
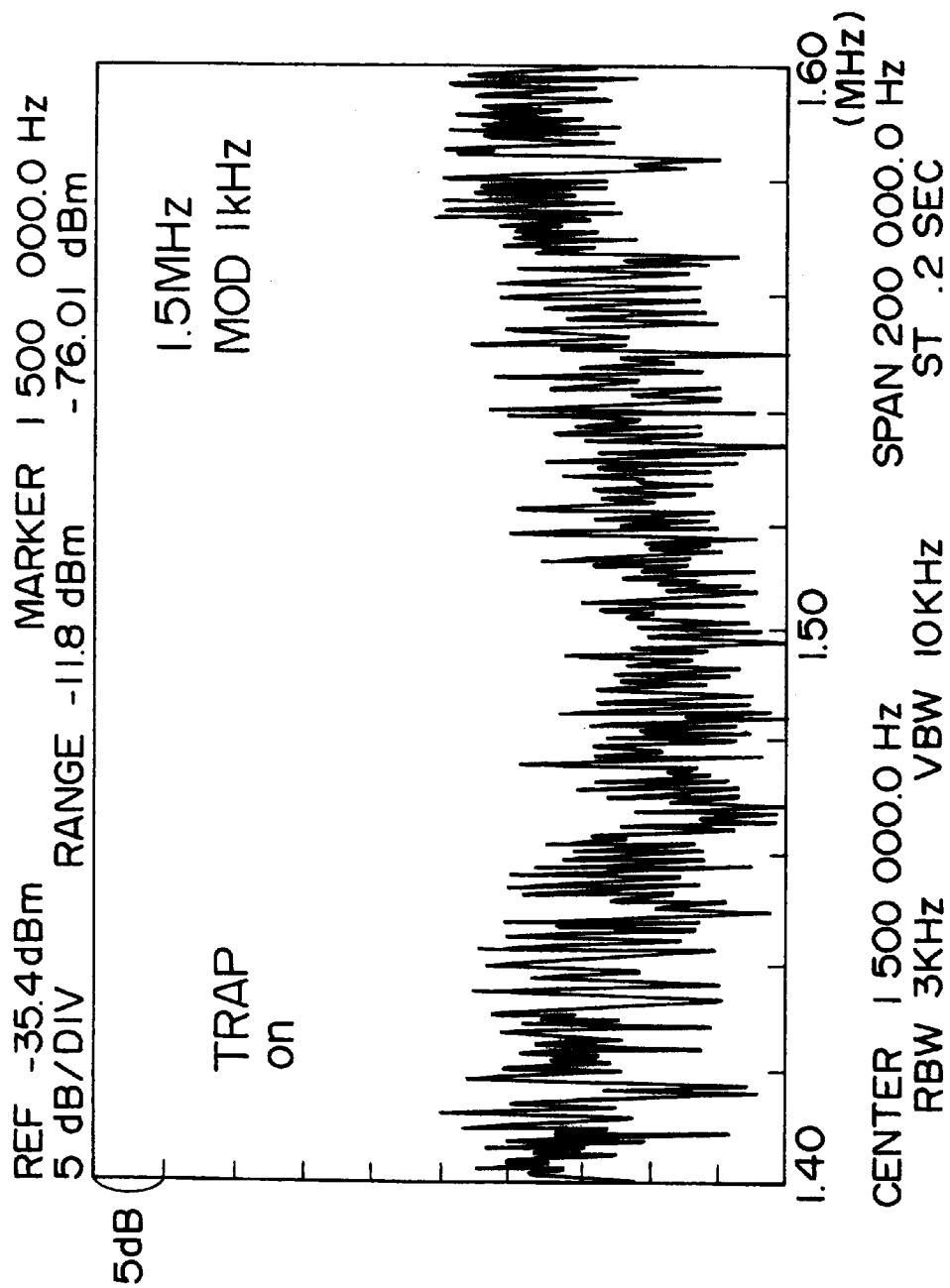

FIGS. 14 and 15 graphically show the output signal characteristics obtained when an AFM signal based on a carrier of 1.5 MHz and frequency-modulated at 1 kHz is passed through the comb filter of FIG. 7. FIG. 14 represents the characteristic in a case where the input from the delay line to the subtracter 21 is switched off, and FIG. 15 represents the characteristic in another case where such input is switched on. As obvious from a comparison between FIGS. 14 and 15, it is seen that the AFM signal is completely trapped by changing the trap frequency in response to the demodulated signal.

Figure 16:
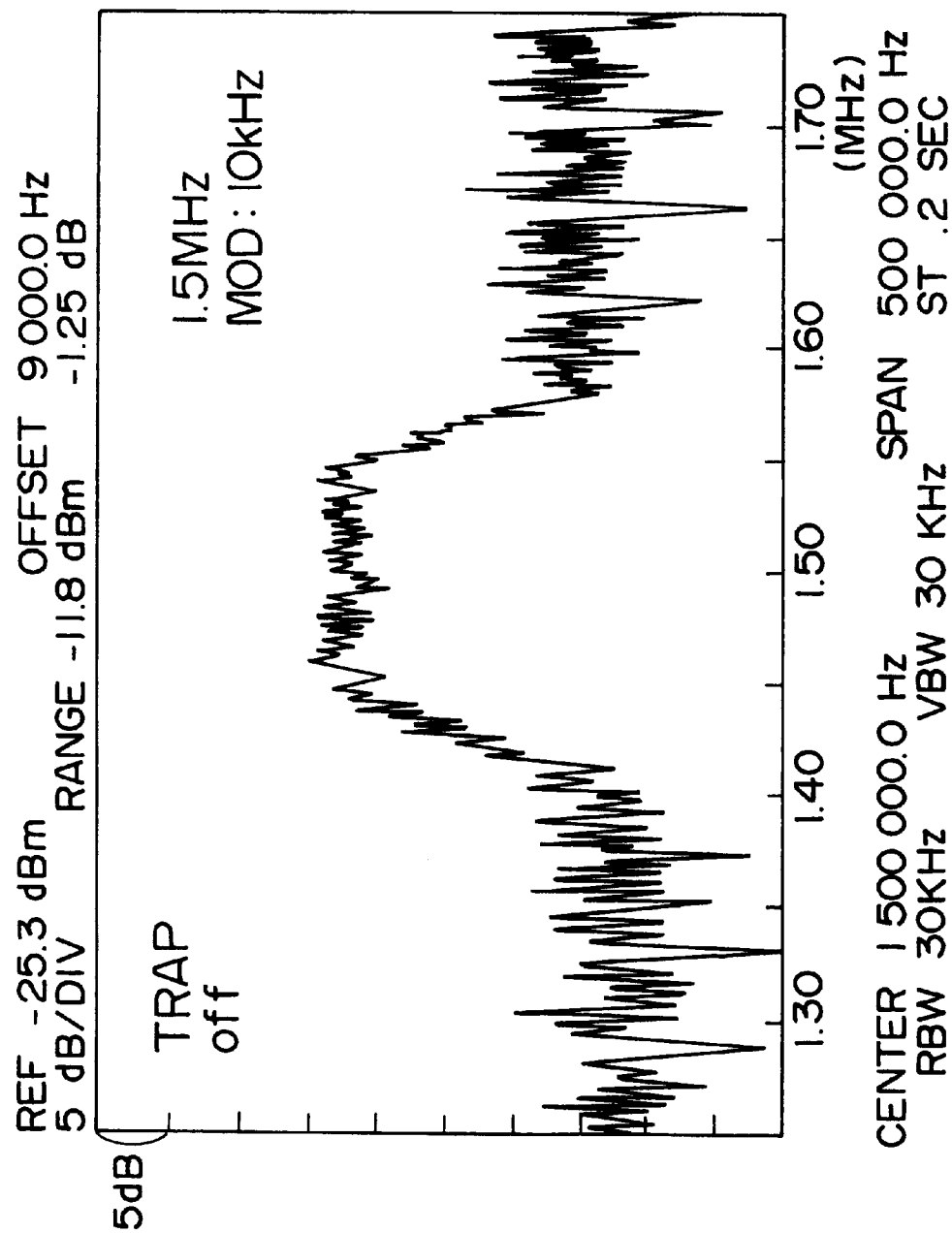
Figure 17:
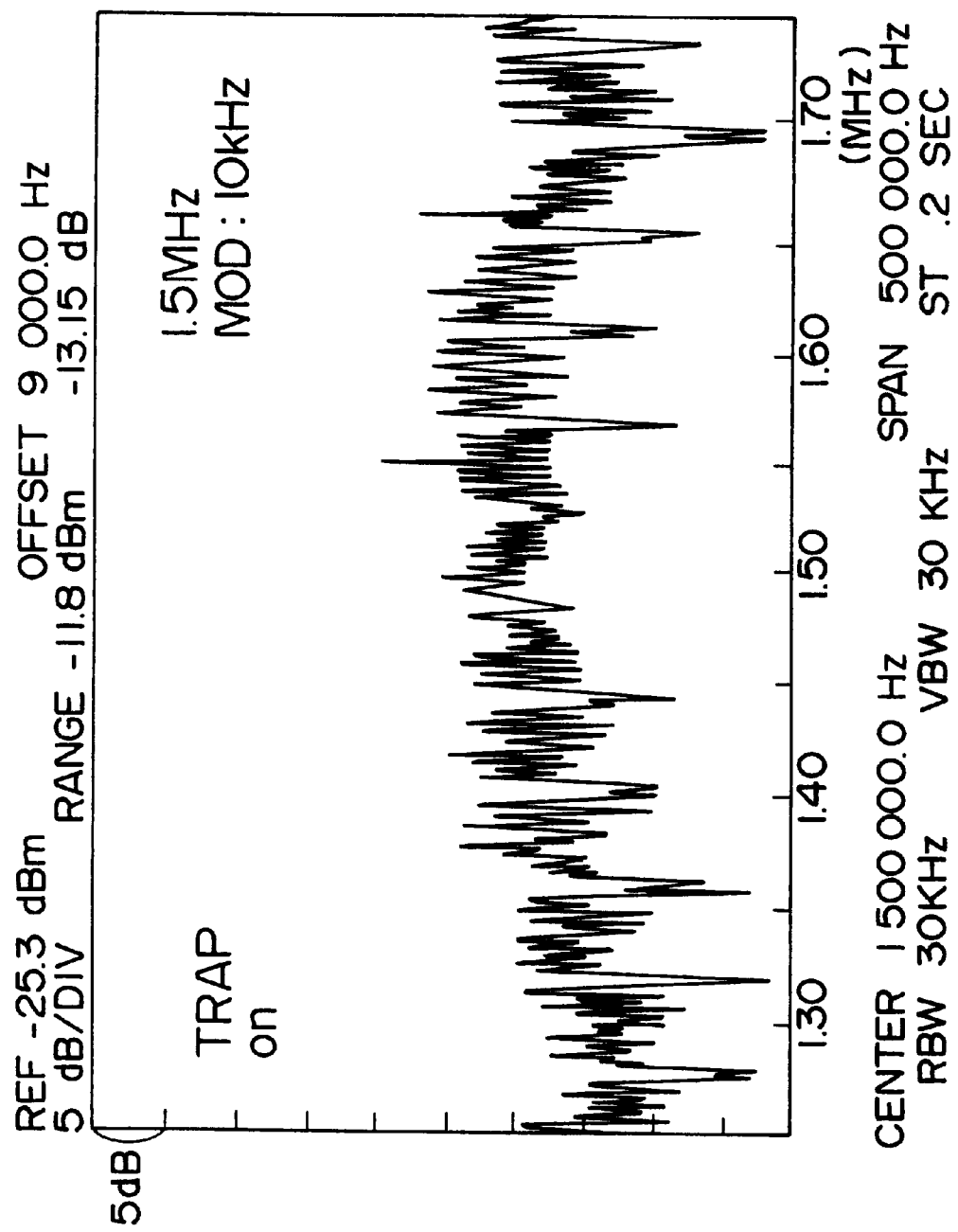

Similarly, FIGS. 16 and 17 graphically show the characteristics obtained in two cases where the input from the delay line is switched off and on when an AFM signal is frequency-modulated at 10 kHz. In this case also, it is seen that sufficient trapping effect can be achieved by changing the trap frequency in response to the demodulated signal.

Figure 18:
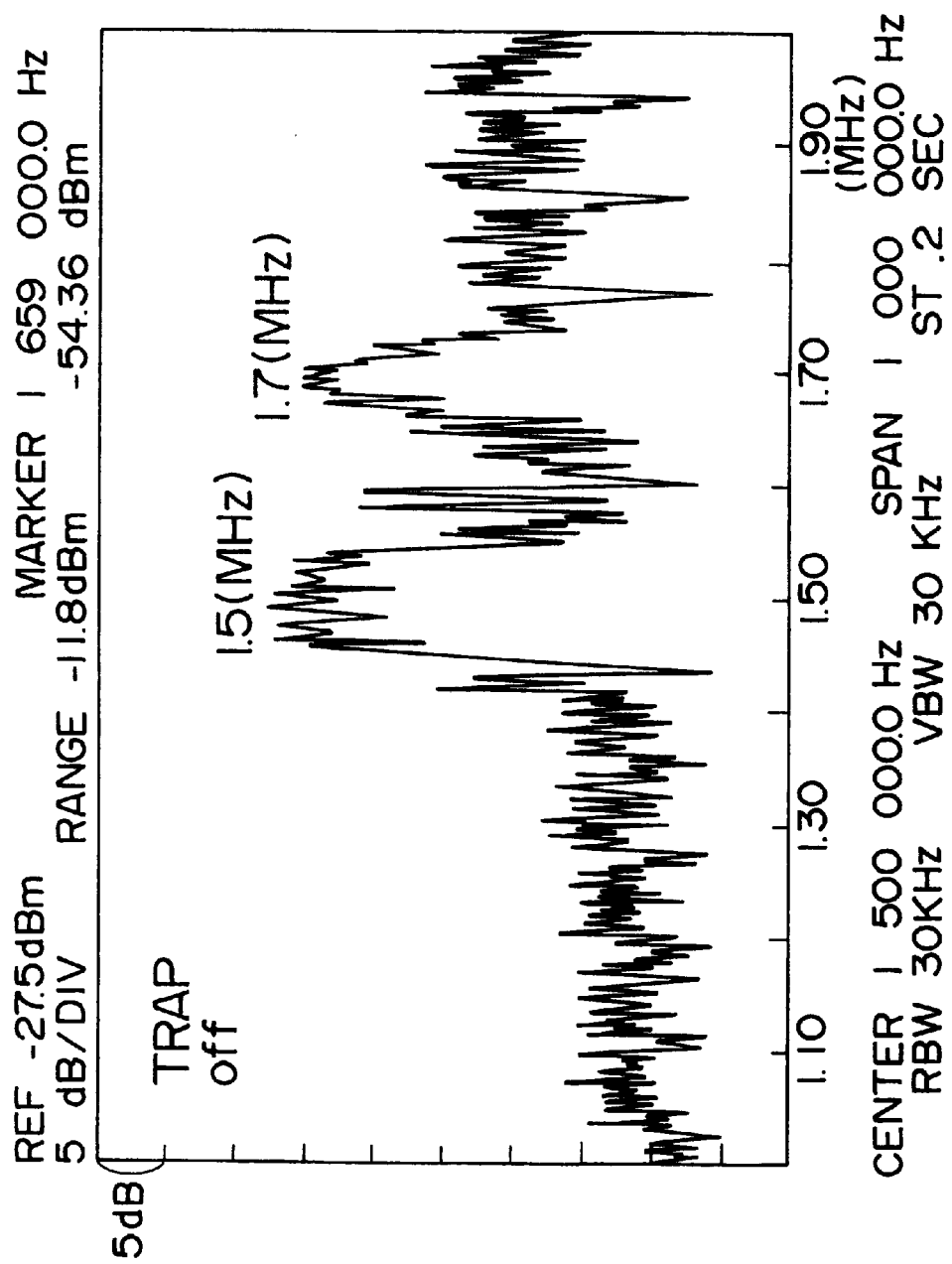
Figure 19:
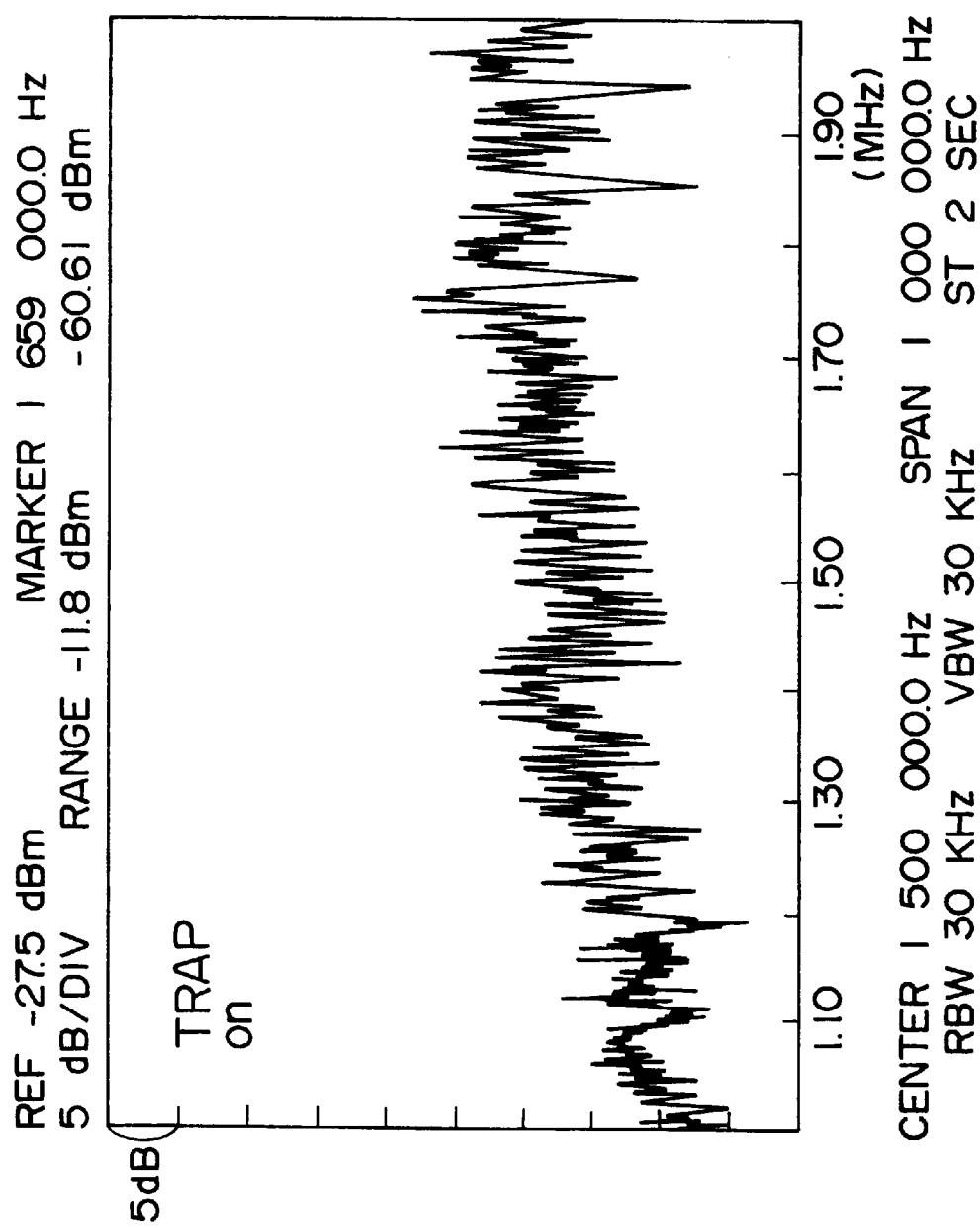

Further, FIGS. 18 and 19 graphically show the characteristics obtained when an AFM signal based on a carrier of 1.5 MHz and an AFM signal based on a carrier of 1.7 MHz are frequency-modulated in accordance with ordinary music information. Similarly to the above, FIG. 18 represents the characteristic in a case where the input from the delay line is switched off, and FIG. 19 represents the characteristic in a case case where such input is switched on. It is seen therefrom that the AFM signal is completely trapped.

Figure 20:
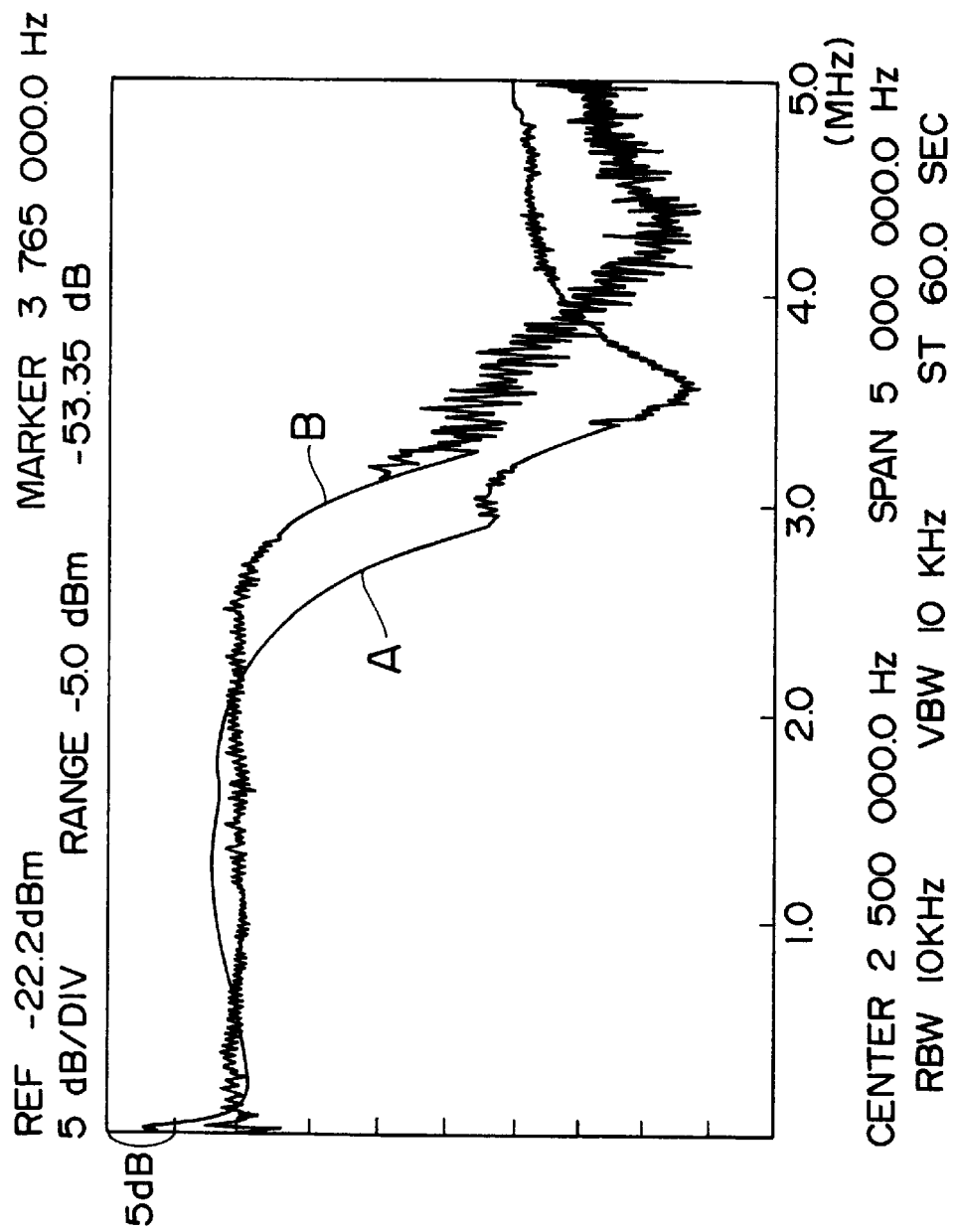
FIG. 20 graphically shows the frequency characteristic of the video signal in the embodiment of FIG. 9.

FIG. 20 graphically shows the frequency characteristics of a replay video signal obtained when an AFM signal is trapped by the comb filter as described above (curve B) and when such AFM signal is trapped by an LC-tuning trap circuit as in the prior art (curve A). As obvious from this graph, the characteristic in a higher frequency range is widely improved in the curve B than in the curve A.

Figure 21:
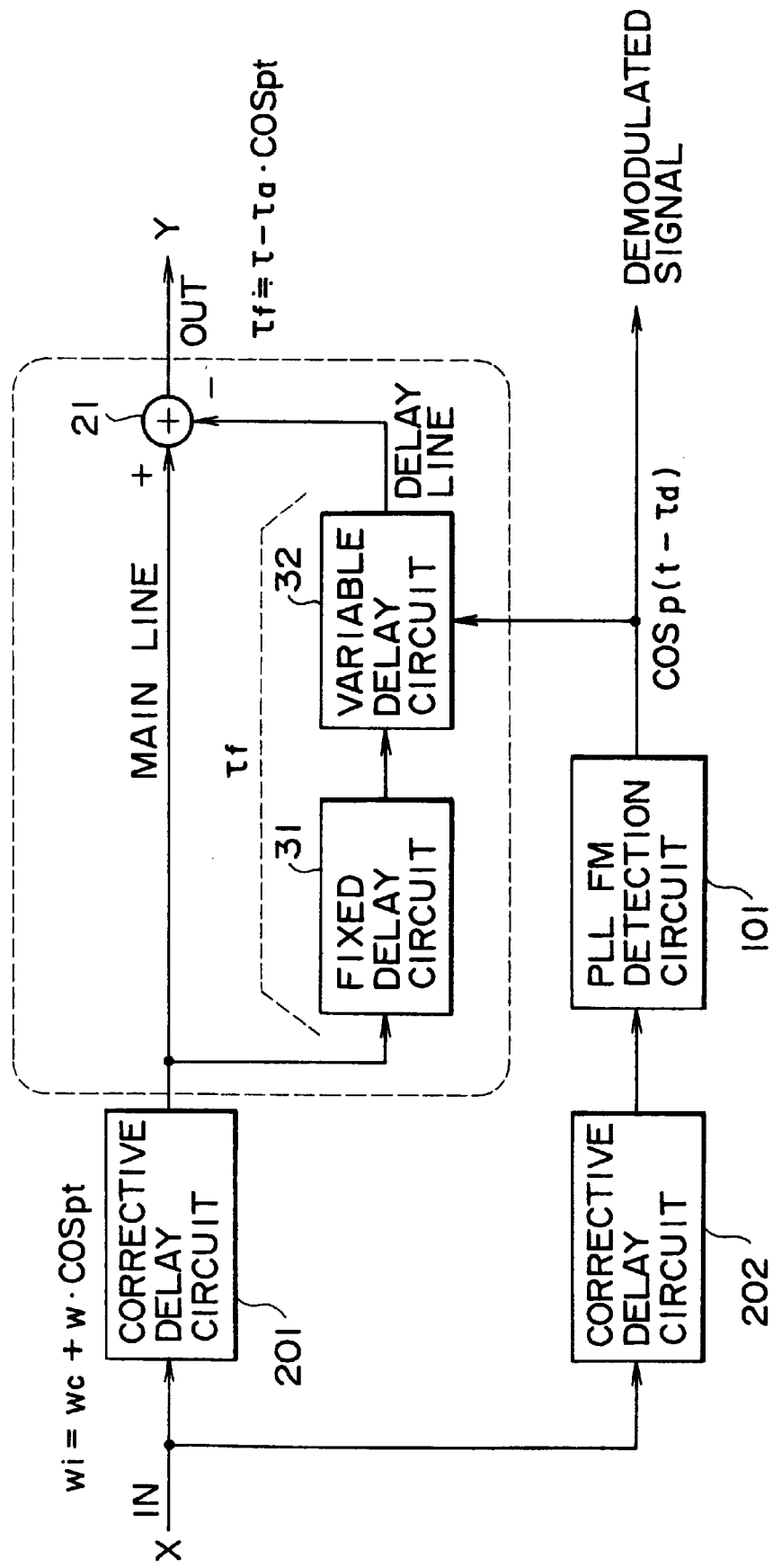
FIGS. 21 to 24 are block diagrams showing other structural examples of the signal trap device of the present invention.

FIG. 21 shows another embodiment where a delay time $\tau_d$ of a demodulated signal is reduced with regard to a main line. If the delay time $\tau_d$ is long, it becomes difficult to achieve adequate trapping effect relative to any FM signal of a wide band or any FM signal modulated at high frequencies. It is therefore preferred that the delay time $\tau_d$ be minimized. In the embodiment of FIG. 21, a corrective delay circuit 201 is inserted in the main line where a frequency multiplex signal is inputted to a subtracter 21. And further a corrective delay circuit 202 is inserted in the input stage of a PLL FM detection circuit 101 which outputs a demodulated signal to a variable delay circuit 32. The other structure is the same as that in FIG. 3.

In this embodiment also, a trap delay time $\tau_f$ is given by the fixed delay circuit 31 and the variable delay circuit 32. Supposing that the delay time resulting from the operation of the PLL FM detection circuit 101 is substantially negligible, the delay time $\tau_d$ of the demodulated signal to the main line in this embodiment can be expressed as follows, wherein τ201 and τ202 denote the delay times in the corrective delay circuits 201 and 202 respectively.

$$\tau_d = \tau 202 - \tau 201$$

Figure 22:
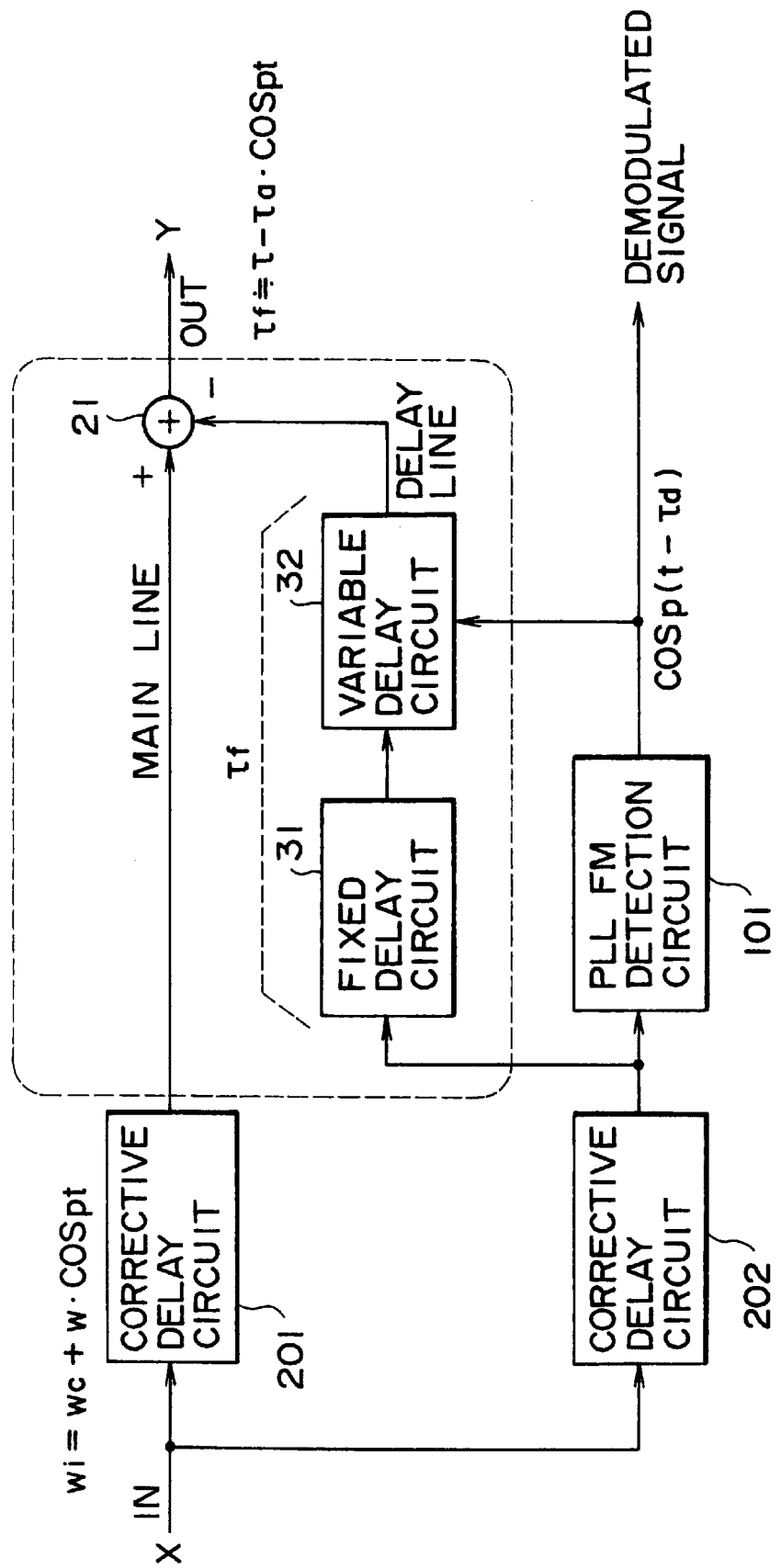

Therefore, if the delay times τ201 and τ202 in the corrective delay circuits 201 and 202 are set to the same value, it becomes possible to reduce the delay time $\tau_d$ to zero to consequently attain a great improvement of the comb characteristic. However, the PLL FM1 detection circuit 101 needs to supply a signal of a predetermined frequency band (in this case, AFM signal obtained by frequency-modulating a carrier of 1.5 MHz). For this reason, the corrective delay circuit 202 is composed normally of a band pass filter. In any band pass filter, the delay time is rendered longer as the frequency band of the signal passing therethrough is narrowed, so that some delay amount is required in the corrective delay circuit 202. But if a satisfactory characteristic can be obtained with a certain amount of correction, it is not exactly necessary to reduce $\tau_d$ to zero, and the difference delay time may be distributed to the trap delay time $\tau_f$. In this case, the input to the fixed delay circuit 31 is supplied from the corrective delay circuit 202. FIG. 22 shows an embodiment for carrying out the above method.

Since it is necessary in the delay line to delay merely the AFM signal to be trapped, the fixed delay circuit 31 is composed normally of a band pass filter. For this reason, the circuit is so formed as shown in FIG. 22, whereby the configuration can be simplified with common use of the band pass filter in the fixed delay circuit 31 as a band pass filter in the corrective delay circuit 202.

In the embodiment of FIG. 22, the output of the corrective delay circuit 202 is supplied, instead of the output of the corrective delay circuit 201, to the fixed delay circuit 31. The other structure is the same as that in FIG. 21.

Figure 23:
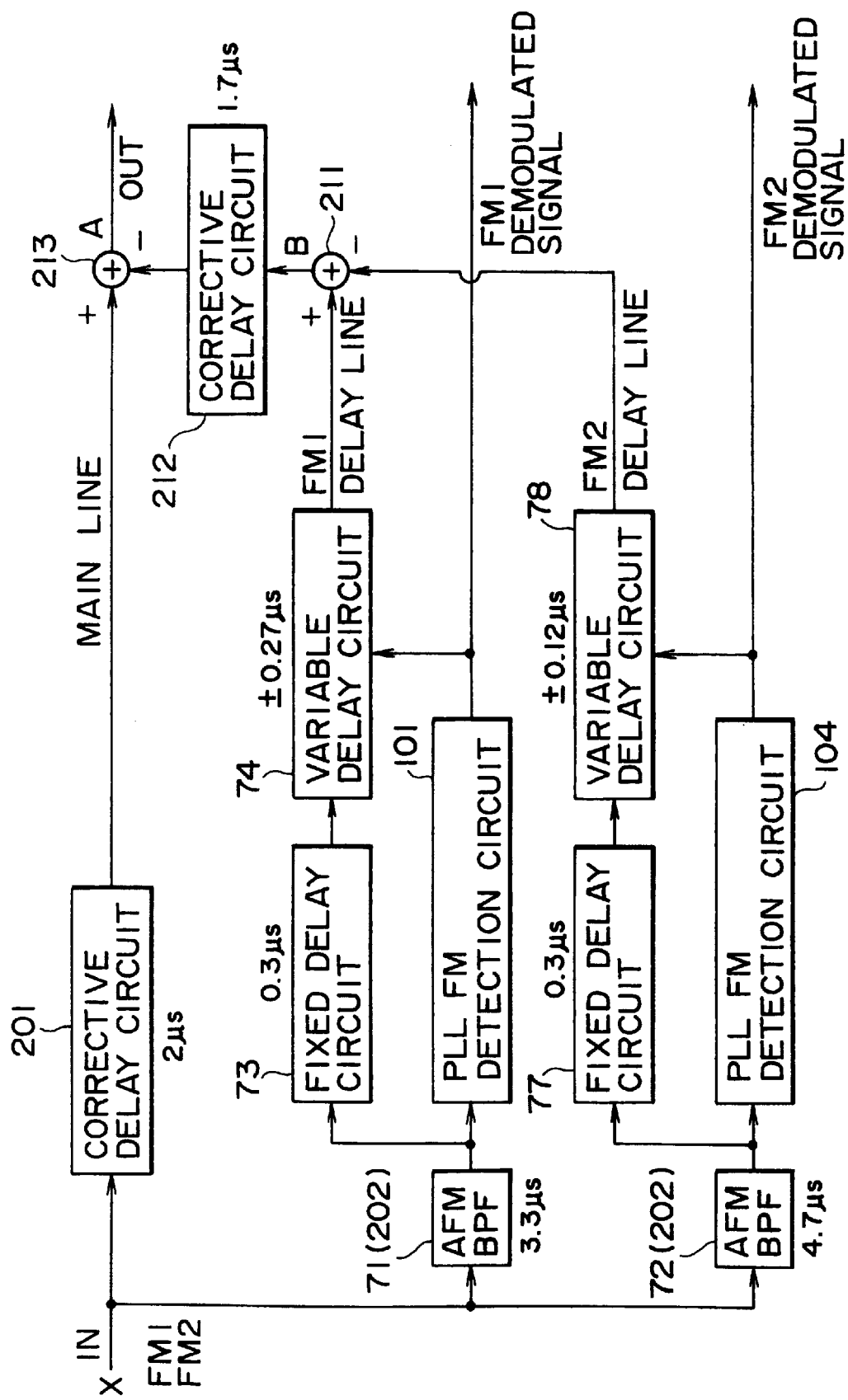

FIG. 23 shows a structural example where the embodiment of FIG. 22 is applied to the embodiment of FIG. 9. That is, in the embodiment of FIG. 23, a replay signal from a record/replay block 61 is supplied via a corrective delay circuit 201 to a subtracter 213 (corresponding to the subtracters 76 and 89 in FIG. 9). The replay signal is supplied also to band pass filters 71 and 72, which serve to extract, respectively, an AFM signal of 1.5 MHz (AFM1 signal) and an AFM signal of 1.7 MHz (AFM2 signal). Each of the band pass filters 71 and 72 corresponds to the corrective delay circuit 202 in FIG. 22.

The output of the band pass filter 71 is supplied to both a PLL FM detection circuit 101 and a fixed delay circuit 73. The AFM1 signal delayed by the fixed delay circuit 73 is inputted to a variable delay circuit 74, where this signal is further delayed in response to a demodulated signal from the PLL FM detection circuit 101, and then the delayed signal is inputted to an adder 211.

Meanwhile the AFM2 signal outputted from the band pass filter 72 is supplied to both a fixed delay circuit 77 and a PLL FM detection circuit 104. The AFM2 signal delayed by the fixed delay circuit 77 is inputted to a variable delay circuit 78, where this signal is further delayed in response to a demodulated signal from the PLL FM detection circuit 104, and then the delayed signal is inputted to the adder 211.

Subsequently in the adder 211, the outputs of the variable delay circuits 74 and 78 are added to each other and then are outputted to a corrective delay circuit 212. Thereafter in the corrective delay circuit 212, the input signal from the adder 211 is further delayed by a predetermined time and is supplied to a subtracter 213, where the output of the corrective delay circuit 212 is subtracted from the output of the corrective delay circuit 201, and then the result of such subtraction is outputted.

In this embodiment, the trap delay time $\tau_f$ relative to the AFM1 signal of 1.5 MHz extracted through the band pass filter 71 is determined by the difference between the delay time of the corrective delay circuit 201 and the sum of the respective delay times of the band pass filter 71, the fixed delay circuit 73, the variable delay circuit 74 and the corrective delay circuit 212. Meanwhile the trap delay time $\tau_f$ relative to the AFM2 signal extracted through the band pass filter 72 is determined by the difference between the delay time of the corrective delay circuit 201 and the sum of the respective delay times of the band pass filter 72, the fixed delay circuit 77, the variable delay circuit 78 and the corrective delay circuit 212.

For example, the respective delay times of the above circuits can be set as follows under conditions that the AFM1 signal extracted through the band pass filter 71 has a frequency of 1.5 MHz±100 kHz and the AFM2 signal extracted through the band pass filter 72 has a frequency of 1.7 MHz±50 kHz.

| | |
|---|---|
| Corrective delay circuit 201 | 2 μs |
| Band pass filter 71 | 3.3 μs |
| Fixed delay circuit 73 | 0.3 μs |
| Variable delay circuit 74 | ±0.27 μs |
| Band pass filter 72 | 4.7 μs |
| Fixed delay circuit 77 | 0.3 μs |
| Variable delay circuit 78 | ±0.12 μs |
| Corrective delay circuit 212 | 1.7 μs |

In this embodiment, the sum of the respective delay times of the corrective delay circuit 212 and the fixed delay circuit 73 is set to be equal to the delay time (2.0 μs) of the corrective delay circuit 201, and similarly the sum of the respective delay times of the corrective delay circuit 212 and the fixed delay circuit 77 is set to be equal to the delay time (2.0 μs) of the corrective delay circuit 201. Consequently, neglecting the delay times of the variable delay circuits 74 and 78, the trap delay time $\tau_f$ for the AFM1 signal is 3.3 μs, and the trap delay time $\tau_f$ for the AFM2 signal is 4.7 μs.

The delay time $\tau_d$ for the AFM1 signal is turned to 1.3 (=3.3−2) μs, and the delay time $\tau_d$ for the AFM2 signal is turned to 2.7 (=4.7−2) μs. If the corrective delay circuit 201 is not inserted, these delay times $\tau_d$ are 3.3 μs and 4.7 μs respectively, whereby it is seen that the values thereof are reduced by insertion of the corrective delay circuit 201.

In this embodiment, the AFM1 signal is delayed by the fixed delay circuit 73 and the variable delay circuit 74, while the AFM2 signal is delayed by the fixed delay circuit 77 and the variable delay circuit 78. And the corrective delay circuit 212 serves to delay both of the AFM1 signal and the AFM2 signal. If the delay times of the fixed delay circuits 73 and 77 are set to 2.0 μs respectively, the corrective delay circuit 212 can be omitted. In such a case, however, it becomes necessary to provide two delay circuits each having a delay time of 2.0 μs. That is, the total delay time is turned to 4 (=2+2) μs.

In contrast therewith, if the corrective delay circuit 212 is inserted to delay both of the AFM1 signal and the AFM2 signal as shown in FIG. 23, the total delay time of the fixed delay circuits 73, 77 and the corrective delay circuit 212 is turned to 2.3 (=0.3+0.3+1.7) μs. Therefore, the structure can be further down-sized by the configuration of FIG. 23.

In another configuration where the fixed delay circuits 73 and 77 are omitted while the delay time of the corrective delay circuit 212 is set to 2.0 μs, it becomes theoretically possible to minimize the structure. Normally, the delay time in each of the variable delay circuits 74 and 78 is adjusted by increasing or decreasing the reference delay time. The fixed delay circuits 73 and 77 serve to give a reference delay time relative to the variable delay circuits 74 and 78. Therefore, viewing the configuration of an actual delay circuit, the delay time in each of the fixed delay circuits 73 and 77 is not reducible to zero, and the variation width of the delay time in each of the variable delay circuits 74 and 78 is set to a reference value which is practically realizable.

Figure 24:
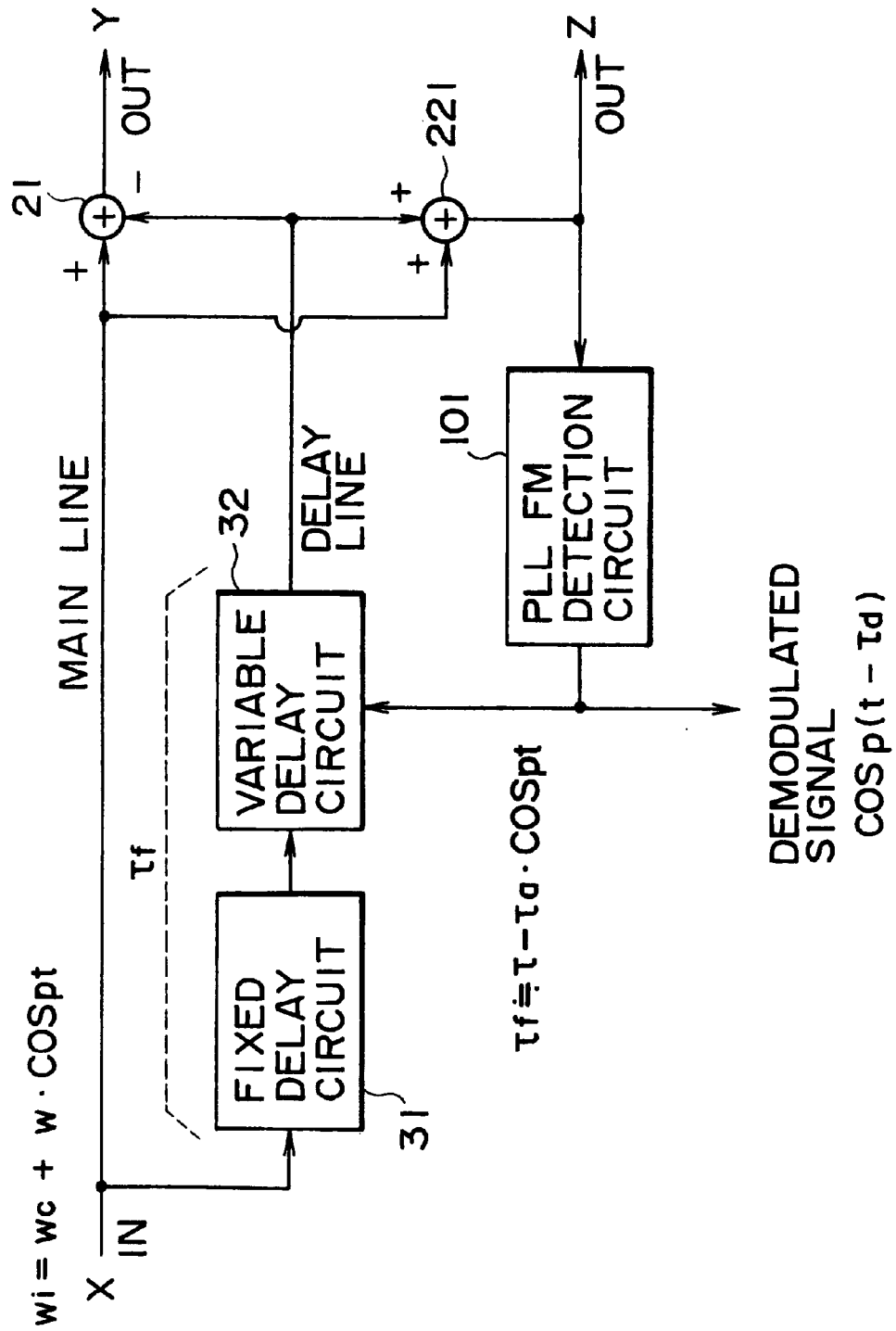

FIG. 24 shows a further embodiment contrived to reduce the delay time $\tau_d$. This embodiment is so formed that a signal of a delay line consisting of a fixed delay circuit 31 and a variable delay circuit 32 is subtracted in a subtracter 21 from a signal of a main line, and the signal of the main line and the signal of the delay line are added to each other in an adder 221, and the output therefrom is supplied to a PLL FM detection circuit 101. Subsequently a demodulated signal outputted from the PLL FM detection circuit 101 is supplied to a variable delay circuit 32. Since the signal (correlated component) included in the delay line can be trapped out of the signal of the main line by subtracting the signal of the delay line from the signal of the main line, it follows that the signal (correlated signal) of the delay line can be obtained as a double level of the signal of the main line by adding the signals of the main line and the delay line in the adder 221.

The output of the adder 221 can be detected and demodulated in the PLL FM detection circuit 101. And the demodulated signal is used to control the delay time of the variable delay circuit 32, so that the delay time $\tau_d$ of the demodulated signal to the signal of the main line is reducible to a half of the trap delay time $\tau_f$.

Thus, it becomes possible to trap the signal of the delay line by subtracting the signal of the delay line from the signal of the main line, and further possible to extract the signal of the delay line by adding the signals of the main line and the delay line to each other.

Figure 25:
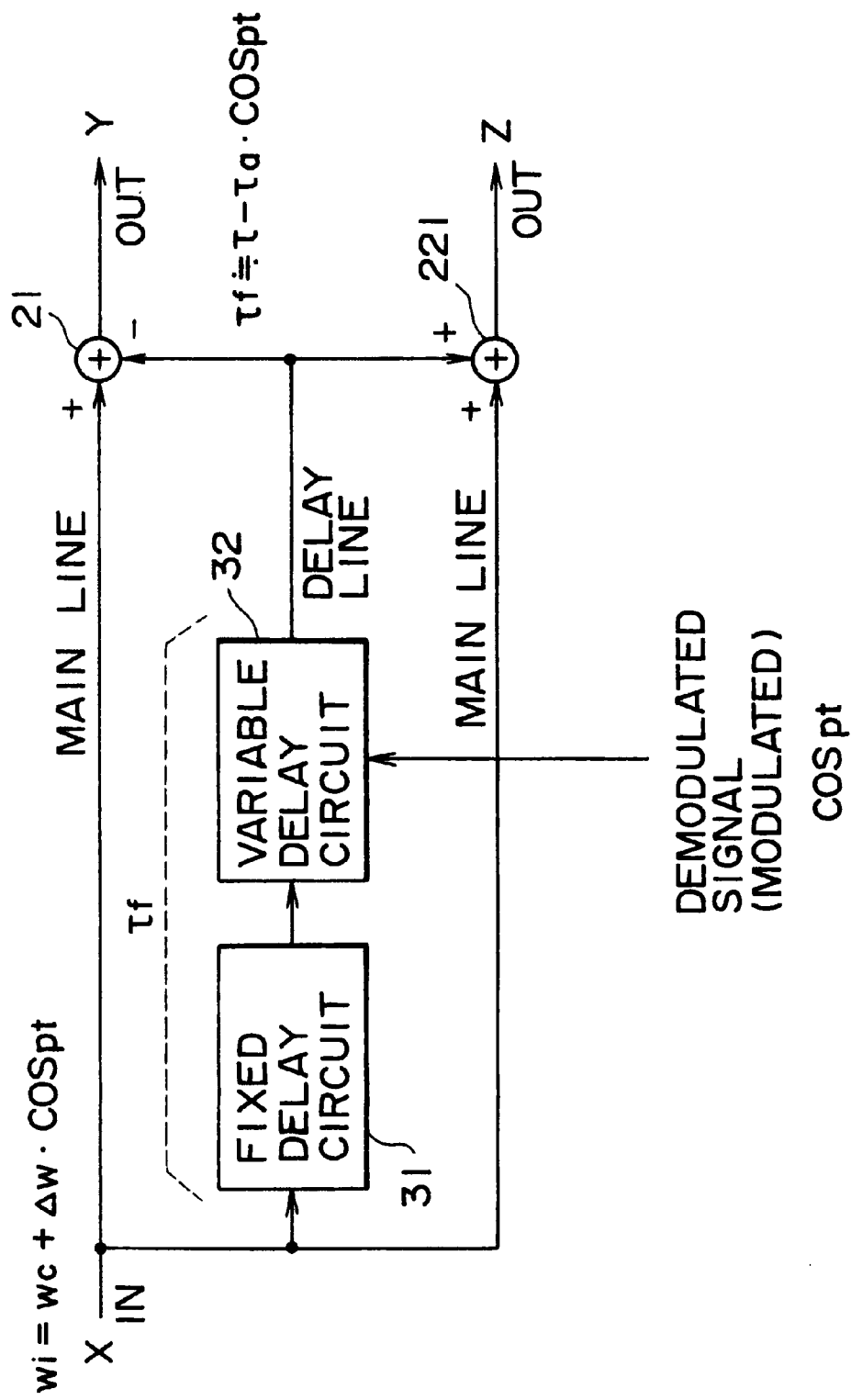
FIG. 25 is a block diagram showing a fundamental structure of the signal trap device and the signal extraction device of the present invention.

FIG. 25 is a block diagram showing a fundamental principle to carry out the above operation. The embodiment of FIG. 25 is so formed that, in a subtracter 21, the output of a delay line consisting of a fixed delay circuit 31 and a variable delay circuit 32 is subtracted from the signal of a main line, whereby the signal of the delay line is trapped and then outputted. Subsequently in an adder 221, the signal of the main line and the signal of the delay line are added to each other, whereby the signal of the delay line is extracted.

Figure 26:
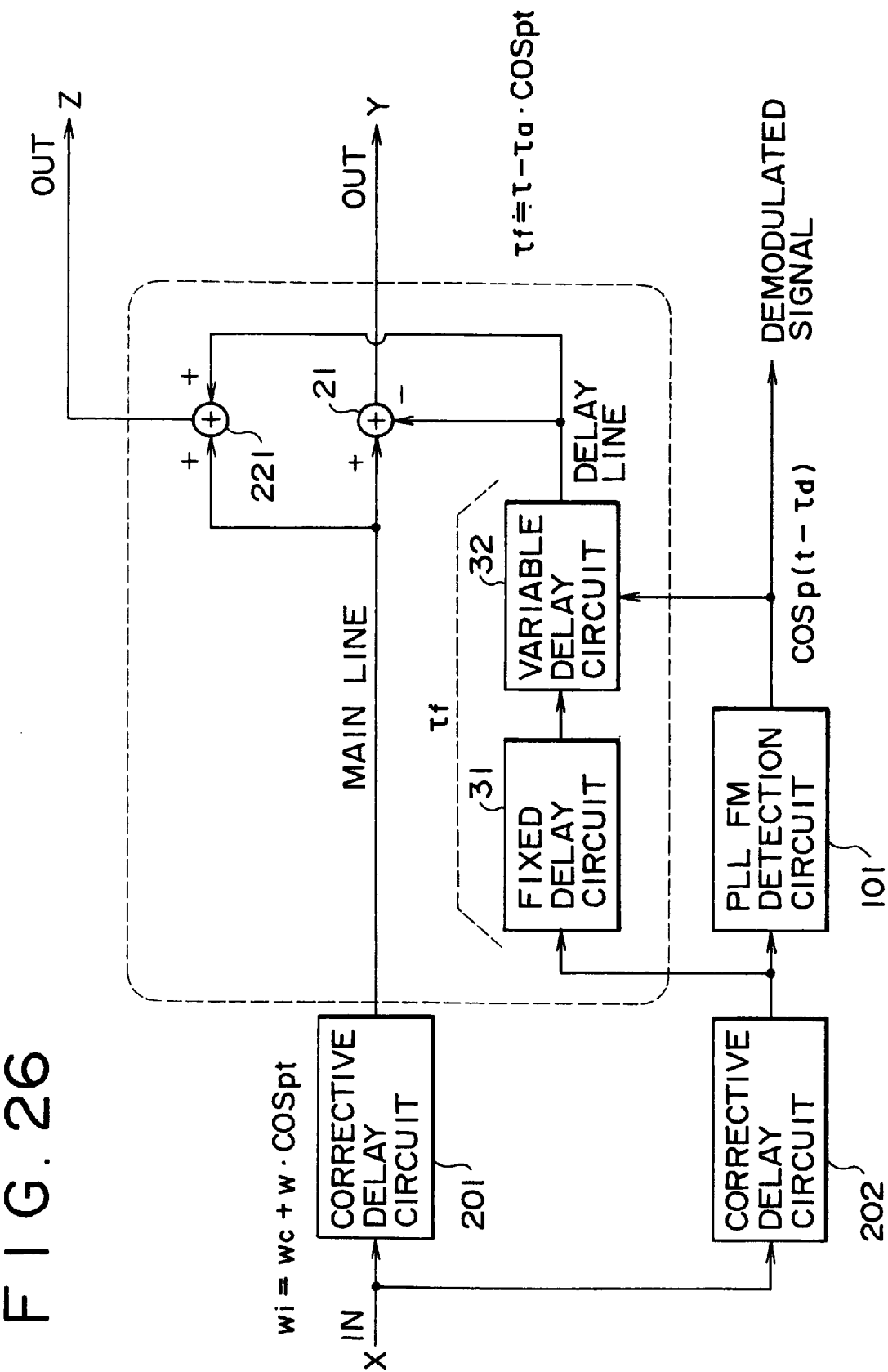
FIG. 26 is another block diagram showing the fundamental structure of the signal trap device and the signal extraction device of the present invention.

FIG. 26 shows a structural example including an adder 221 inserted additionally in the embodiment of FIG. 22, wherein the signal of a main line and the signal of a delay line are added to each other so that the signal of the delay line is extracted. As the signals of the main and delay lines are added and outputted in this manner, the transfer characteristic thereof is such as represented by a solid line in FIGS. 27A to 27C.

In each of FIGS. 27A to 27C, a broken line represents the transfer characteristic of a band pass filter which constitutes a fixed delay circuit 31 and has a bandwidth of $2\Delta w_c$, where $\tau = n\tau_c \approx \pi/(2\Delta w_c)$. When its instantaneous carrier frequency is positioned at the center (in the vicinity of a trap frequency $f_c$) as shown in FIG. 27A, the level of the output signal is rendered smaller as the frequency is changed to be either lower or higher. And if the center frequency is shifted to be lower within the bandwidth range of the band pass filter (fixed delay circuit 31) as shown in FIG. 27B or to be higher within such range as shown in FIG. 27C, the signal level in the vicinity of the center of the passing bandwidth is attenuated. Thus, in each of FIGS. 27A to 27C, the hatched portion between the broken line representing the passing bandwidth and the solid line representing the transfer characteristic is more attenuated than in another case (denoted by the broken line) where a predetermined frequency component is extracted through an ordinary band pass filter. That is, the in-band disturbance elimination characteristic is improved correspondingly to the removal of the component in the hatched portion, whereby the carrier-to-noise ratio is rendered more satisfactory.

Figure 28:
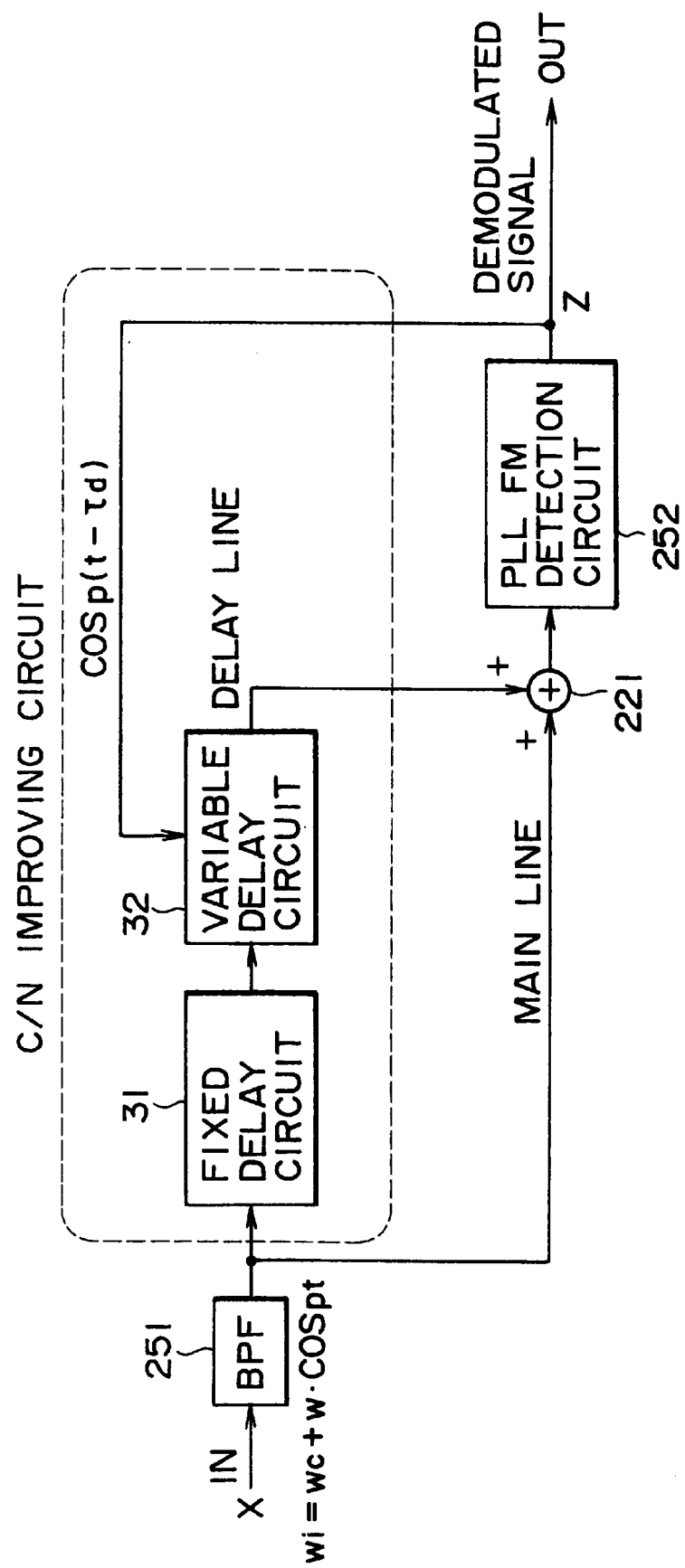
FIG. 28 is a block diagram showing an example where the signal extraction device of the present invention is applied.

FIG. 28 shows an example of applying the principle to extract a desired signal by adding signals of a main line and a delay line to each other. In this embodiment, an intermediate-frequency signal from a tuner to receive an FM broadcast for example is extracted through a band pass filter 251 and then is supplied to an adder 221 via a main line while being supplied to the adder 221 via a delay line which consists of a fixed delay circuit 31 and a variable delay circuit 32. In a PLL FM detection circuit 252, the output of the adder 221 is FM-detected, and then the demodulated signal is supplied to an unshown circuit while being supplied also to the variable delay circuit 32 for controlling the delay time of the circuit 32.

In this embodiment also, the delay time $\tau_d$ of the demodulated signal to the main line is reduced to a half of the delay time $\tau_f$ in the delay line, so that the C/N can be improved more than in another case of directly detecting the output of the band pass filter 251 by the PLL FM detection circuit 252. Consequently, it becomes possible to extract and receive a desired signal with certainty even when the electric field intensity is lowered for example.

The description given above on the present invention is concerned with an exemplary case of trapping an AFM signal in an 8 mm-tape video cassette recorder. However, it is to be noted that the invention is applicable also to another case of trapping a predetermined FM signal while separating other FM signals from a plurality of frequency-multiplexed FM signals reproduced from some other recording medium or delivered to a transmission line. And it is further possible to apply the present invention to extraction of a desired signal in some other device than an FM tuner.

Thus, according to the signal trap device and method of the present invention, an FM signal delayed in response to a demodulated signal is subtracted from frequency multiplexed signals, so that the desired FM signal can be trapped exactly while any harmful influence on the other FM signals is minimized.

According to the recording medium replay device and method of the present invention, an FM signal delayed in response to a first demodulated signal is subtracted from a replay signal, and a second FM signal is demodulated from the signal obtained through such subtraction, whereby the second FM signal can be reproduced exactly without being harmfully affected by the first FM signal.

Further according to the signal extraction device and method of the present invention, an FM signal is delayed in response to a demodulated signal, and the frequency multiplexed signal and the delayed FM signal are added to each other, so that the FM signal can be extracted with certainty in a simplified circuit configuration.

Although the present invention has been described hereinabove with reference to some preferred embodiments thereof, it is to be understood that the invention is not limited to such embodiments alone, and a variety of other changes and modifications will be apparent to those skilled in the art without departing from the spirit of the invention.

The scope of the invention, therefore, is to be determined solely by the appended claims.

What is claimed is:

1. A signal trap device for trapping a predetermined FM signal out of a frequency multiplexed signal where a plurality of FM signals are included in a frequency multiplexed form, said device comprising:

a demodulation means for demodulating the predetermined FM signal to be trapped and then outputting the demodulated signal;

a delay means for delaying the FM signal to be trapped in response to the demodulated signal outputted from said demodulation means; and a subtraction means for subtracting, from said frequency multiplexed signal, the delayed FM signal obtained from said delay means.

2. The signal trap device according to claim 1, wherein said delay means delays the predetermined FM signal by at least the sum of the time corresponding to the fundamental frequency of said FM signal and the time corresponding to said demodulated signal.

3. The signal trap device according to claim 2, wherein said delay means further delays the predetermined FM signal by the time corresponding to the temporal change of said demodulated signal.

4. The signal trap device according to claim 2, wherein said delay means consists of a first delay means for delaying the frequency multiplexed signal supplied to said subtraction means, and a second delay means for delaying the FM signal supplied to said subtraction means.

5. The signal trap device according to claim 4, wherein said FM signal includes a first FM signal and a second FM signal, and said demodulation means demodulates said first and second FM signals individually; and said second delay means consists of a third delay means for delaying said first and second FM signals individually, and a fourth delay means for delaying said first and second FM signals in common.

6. The signal trap device according to claim 1, wherein said demodulation means demodulates the modulated signal with a phase-locked loop.

7. The signal trap device according to claim 1, wherein said delay means delays the FM signal in response to the demodulated signal prior to correction of the amplitude, the frequency characteristic or the phase characteristic of the first-mentioned demodulated signal.

8. The signal trap device according to claim 1, further comprising an addition means for adding the frequency multiplexed signal and the delayed FM signal outputted from said delay means, and then supplying the result of such addition to said demodulation means to thereby demodulate the same.

9. A signal trap method for trapping a predetermined FM signal out of a frequency multiplexed signal where a plurality of FM signals are included in a frequency multiplexed form, said method comprising the steps of:

demodulating the predetermined FM signal to be trapped and then outputting the demodulated signal;

delaying the FM signal to be trapped in response to the demodulated signal; and subtracting the delayed FM signal from said frequency multiplexed signal.

10. A recording medium replay device for demodulating a first FM signal and a second FM signal after separating the same from a replay signal reproduced from a recording medium where the first and second FM signals are recorded in a frequency multiplexed form, said replay device comprising:

an extraction means for extracting the first FM signal from the replay signal;

a first demodulation means for demodulating the extracted first FM signal and outputting a first demodulated signal;

a delay means for delaying the extracted first FM signal in response to the first demodulated signal outputted from said first demodulation means;

a subtraction means for subtracting, from the replay signal, the first FM signal delayed by said delay means; and a second demodulation means for demodulating the second FM signal from the output of said subtraction means and then outputting a second demodulated signal.

11. A recording medium replay method for demodulating a first FM signal and a second FM signal after separating the same from a replay signal reproduced from a recording medium where the first and second FM signals are recorded in a frequency multiplexed form, said method comprising the steps of:

extracting the first FM signal from the replay signal reproduced from said recording medium;

demodulating the extracted first FM signal and outputting a first demodulated signal;

delaying the extracted first FM signal in response to the first demodulated signal;

subtracting the delayed first FM signal from the replay signal; and demodulating the second FM signal from the signal obtained by such subtraction and then outputting a second demodulated signal.

12. A signal extraction device for extracting a predetermined FM signal from a frequency multiplexed signal where a plurality of FM signals are included in a frequency multiplexed form, said device comprising:

a demodulation means for demodulating the predetermined FM signal to be extracted and then outputting the demodulated signal;

a delay means for delaying the FM signal to be extracted in response to the demodulated signal outputted from said demodulation means; and an addition means for adding the frequency multiplexed signal and the FM signal delayed by said delay means.

13. The signal extraction device according to claim 12, 4wherein said demodulation means demodulates the output of said addition means.

14. A signal extraction method for extracting a predetermined FM signal from a frequency multiplexed signal where a plurality of FM signals are included in a frequency multiplexed form, said method comprising the steps of:

demodulating the predetermined FM signal to be extracted and then outputting the demodulated signal;

delaying the FM signal to be extracted in response to the demodulated signal; and adding the frequency multiplexed signal and the delayed FM signal to each other.

* * * * *